United States Patent
Kohlert et al.

(10) Patent No.: US 7,660,175 B2
(45) Date of Patent: Feb. 9, 2010

(54) INTEGRATED CIRCUIT, METHOD FOR ACQUIRING DATA AND MEASUREMENT SYSTEM

(75) Inventors: Dieter Kohlert, Pentling (DE); Erhard Sixt, Mainburg (DE); Rainer Holmer, Steinach (DE); Georg Seidemann, Landshut (DE); Berthold Schuderer, Regensburg (DE); Gunther Mackh, Neumarkt (DE); Sabine Penka, Unterhaching (DE); Grit Schwalbe-Dietrich, Dresden (DE); Bernhard Duschinger, Teublitz (DE); Josef Hermann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 12/040,719

(22) Filed: Feb. 29, 2008

(65) Prior Publication Data

US 2009/0219773 A1 Sep. 3, 2009

(51) Int. Cl.
*G11C 7/00* (2006.01)

(52) U.S. Cl. .................. 365/201; 365/185.02; 365/191; 365/226

(58) Field of Classification Search ................. 365/201, 365/185.02, 191, 226
See application file for complete search history.

(56) References Cited

U.S. PATENT DOCUMENTS

| | | | | |
|---|---|---|---|---|
| 5,361,232 A | * | 11/1994 | Petschauer et al. | ........... 365/201 |
| 5,453,954 A | * | 9/1995 | Nakamura | ................... 365/201 |
| 5,675,539 A | * | 10/1997 | Mirabel et al. | ......... 365/185.25 |
| 6,865,113 B2 | * | 3/2005 | Voicu et al. | ............ 365/185.28 |

* cited by examiner

*Primary Examiner*—Pho M. Luu
(74) *Attorney, Agent, or Firm*—Slater & Matsil, L.L.P.

(57) ABSTRACT

An embodiment of an integrated circuit comprises a plurality of cells. Each cell comprises a first supply node, a second supply node, a series connection with a first transistor, a second transistor and an electrical element. The series connection is coupled between the first and the second supply node. The electrical element includes a first and a second node. A third transistor is coupled between the first node of the electrical element and a first output node of the cell and a fourth transistor is coupled between the second node of the electrical element and the second output node of the cell. A control terminal of the first, the third and the fourth transistor is coupled to a first control node of the cell and a control terminal of the second transistor is coupled to a second control node of the cell.

25 Claims, 17 Drawing Sheets

INTEGRATED CIRCUIT, METHOD FOR ACQUIRING DATA AND MEASUREMENT SYSTEM

TECHNICAL FIELD

Embodiments of the present invention relate to integrated circuits, methods for acquiring data and measurement systems employable, for example, in test processes, trial processes, optimization processes, or other scheduling-specific, fabrication-specific or design-specific processes in the area of integrated circuits.

BACKGROUND

Nowadays, integrated circuits are utilized in a multitude of application fields such as in the area of sensors, actors, processors, memories and other technical fields. Frequently, combinations of the above-mentioned device types are used such as in the area of intelligent sensors comprising, next to the actual sensor elements, circuits with memories and arithmetic units for a compensation of environmental influences as well as other fabrication-related influences.

Integrated circuits are also used in the different levels of complexity. Thus, both simple electrical or electronic devices such as resistors, transistors, diodes or capacitors are manufactured in the form of integrated circuits as well as highly complex circuits for special applications enabling, for example, fast and efficient data manipulation or computation.

Integrated circuits often comprise electrical elements of substantial importance for the later application or intended use. In the case of sensors, the individual sensor elements, which are sensitive to physical, chemical, mechanical, electrical or biological influences to be acquired or detected, may be concerned. In the case of memories, these electrical elements may be memory cells, individual components thereof, that is, capacitors or transistors, for example, or other structures. Also in the field of other integrated circuits there frequently are electrical circuit elements having a certain bearing on the specific function or the general function of the integrated circuit. Electrical elements more or less irrelevant for the actual target function of the integrated circuit, which may, however, have a very important bearing on the fundamental functioning, are also often found in integrated circuits.

For cost-effective, reliable and safe fabrication of such integrated circuits, it is often advisable to evaluate design-specific, preparation-specific or other parameters having an undesired effect on such individual electrical elements of the integrated circuit concerned. So as to be able to account for these influences in design, process scheduling and other manufacturing steps, it may be advisable to investigate individual process steps with specific view to individual electrical elements so as to be able to introduce the respective results into the design or process scheduling.

BRIEF DESCRIPTION OF THE DRAWINGS

In the following, embodiments of the present invention are explained in greater detail referring to the accompanying drawings.

DETAILED DESCRIPTION OF ILLUSTRATIVE EMBODIMENTS

Figure 1:
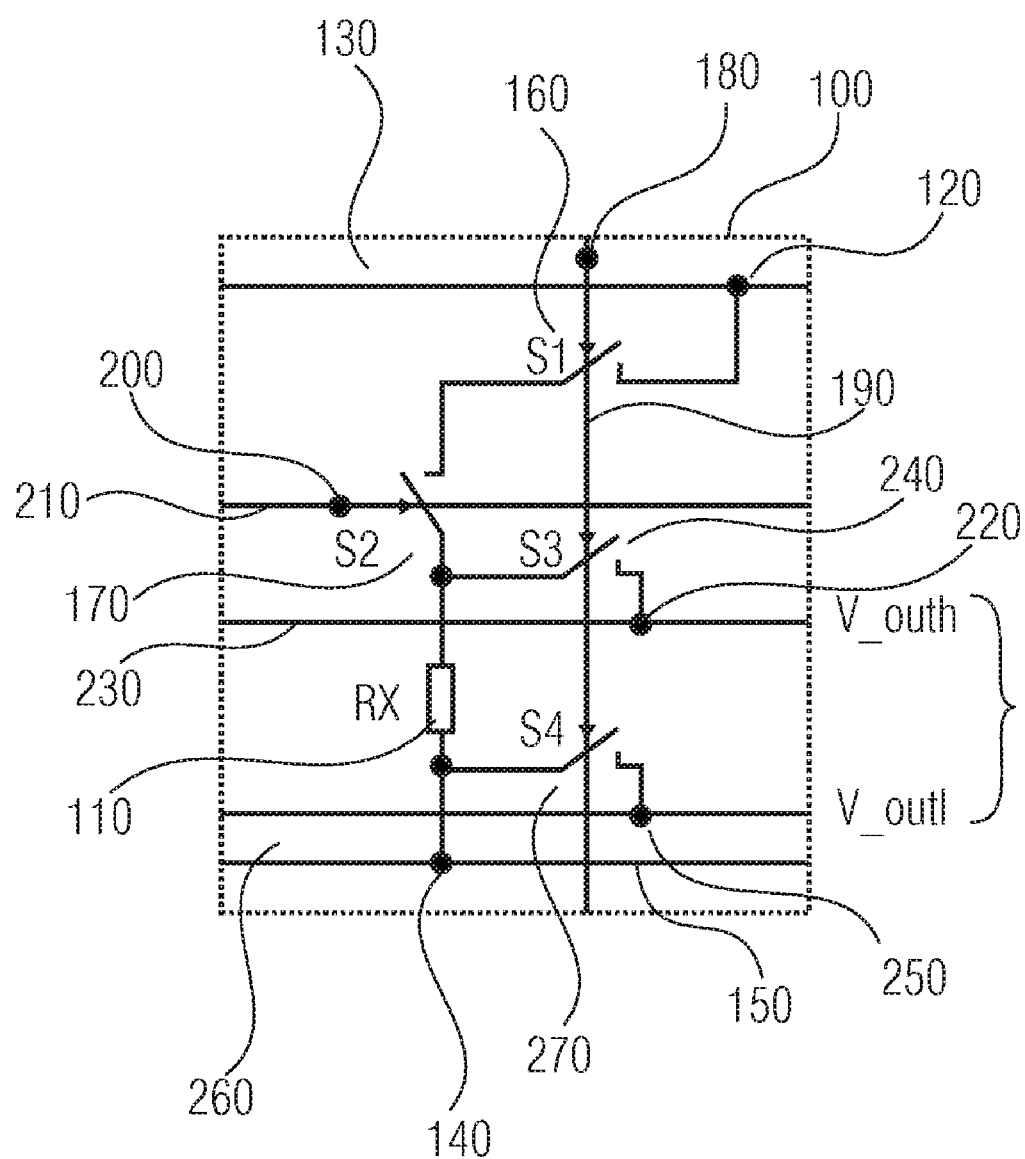
FIG. 1 shows a simplified circuit diagram of a cell of an integrated circuit according to an embodiment of the present invention.

Referring to FIGS. 1 to 17, embodiments of the present invention in the form of integrated circuits, methods for acquiring measurement data and measurement systems will be described in the further course of the description. However, before the individual embodiments of the present invention are explained in greater detail, a short description of possible application scenarios will first be presented for a better coordination thereof.

Integrated circuits, which also include semiconductor devices in the broadest sense, are employed in a multitude of application fields. They are used in the field of sensors, actors and simple semiconductor circuit elements (such as in diodes or transistors for high-current, high-voltage or high-frequency applications) up to highly integrated circuits such as processors, central processing units (CPUs), graphic processing units (GPUs), crypto processors and other special-purpose processors. Alternatively or additionally, there are the most diversified memory circuits and combinations thereof.

In many cases, integrated circuits are based on electrical elements that are of extreme importance for the actual function of the integrated circuit in question, for example. Examples of these are sensor elements in the case of sensors or central electrical elements of single memory cells in the case of highly integrated memory circuits. Also in the area of peripheral circuit elements, there are individual electrical elements that may substantially influence the total performance of an integrated circuit. The case may be, for example, that an individual line interruption, in the case of a multitude of integrated circuits of a specific type and a specific charge, may result in a massive increase in the failure rate or a massive reduction of the yield of the respective production. Examples of such electrical elements are electrical lines, diodes, transistors, vertically running conductive connections (vias) and other electrical circuit elements. The group of electrical elements, however, also comprises individual resistive elements such as resistive elements, capacitive elements (such as capacitors or trench capacitors), inductive elements (such as certain conductor geometries), circuits comprising one or more of the previously mentioned elements (e.g., an array of vias) and also complex circuit elements such as DRAM cells (DRAM=dynamic random access memory), SRAM cells (SRAM=static random access memory). In addition to that, the group of electrical elements also comprises even more complex circuits such as special-purpose circuits for the calculation of cryptographic algorithms or similar applications or even arithmetic logic units (ALUs).

For the purpose of simplifying the following description of embodiments of the present invention, electrical elements in the form of resistive elements only, in particular so-called vias, will be illustrated in the following. Embodiments of the present invention are, however, not limited thereto as shown by the above listing.

Basically, vias are vertically running, conductive connections of two conductive layers running on top of each other and separated from each other by an insulating layer. Here, the via forms an electrical contacting in an aperture or hole of the above-mentioned insulating layer. Vias are frequently manufactured from doped or highly doped poly-silicon or metal or metal alloys. The two conductive layers above and below the insulating layer, which are electrically contacted to each other by the via, may also be fabricated from a semiconducting material, a metal or a metal alloy, depending on the precise implementation. Therefore, any of these layers may, for example, be a semiconductor layer, a poly-silicon layer or even a metal or metal-alloy layer.

The fabrication of semiconductor elements frequently comprises an extremely complex sequence of individual processes such as the depositing or ablation of layers (such as conductive layers and dielectrics), the lithographical imaging of patterns by means of exposure and development of photo resists, dry (plasma-based) or wet-chemical etching processes, oven processes and cleansing steps. For manufacturing a CMOS package (CMOS=complementary metal oxide semiconductor), often up to several hundred individual process steps are required, which might be precisely adjusted to one another and to some extent be performed in an exact time pattern. The basic material in the semiconductor-device fabrication is mostly silicon, less frequently, mixed semiconductors such as gallium arsenide (GaAs) or SOI (silicon on insulator) in the form of wafers or substrates of other shapes (such as rectangular or square chips) being used.

From an economical point of view, semiconductor fabrication is extremely investment-intensive mass production, which may not be profitably realizable, in particular with standard devices, so-called commodity devices, which yield relatively low retail prices on the market, unless the production achieves a high yield (portion of salable devices of the entire amount produced) and a high quality. For illustrating the problem of the production yield and quality, and the requirements regarding the sequence of the individual processes in the production resulting there from, the following example is given.

If a CMOS wafer is manufactured by a sequence of 300 individual processes, for example, a yield of the respective individual process (=1−probability formal-processing or process impairment) of x %, will result in a yield of x300% for the entire process flow. At a yield for the individual process of 99%, the result would be a total yield of only 4.9%. For obtaining economically sensible yields of around 98%, an average statistical yield for an individual process of approximately 99.995% would have to be ensured, which corresponds to a probability of a process disturbance of approximately 50 ppm (ppm=parts per million) as a statistic average.

This example shows that in processes in the semiconductor fabrication, even low error rates in the ppm range will result in a significant yield loss. So as to be able to detect disturbances or errors in the processing at such low occurrences in the ensemble of the individual steps of fabrication, a sufficiently large random sample in the form of a test structure, which allows recognizing statistically significant conspicuities or deviations in the manufacturing process, would be helpful.

Thus, embodiments of the present invention enable electrically connecting a plurality of electrical elements, that is, the vias considered in the following, for example, to form a measurement arrangement so as to enable a statistical analysis of electrical properties and characteristics of these electrical elements in particular, under consideration of process-, design- or other element-specific parameter variations. Embodiments of the present invention therefore in particular allow for implementing a novel concept for identifying early failure modes and, if need be, assessing respective error rates.

Embodiments of the present invention may therefore be used in the field of the so-called extrinsic via reliability monitoring for determining the so-called extrinsic via error rate for technologies for manufacturing automotive applications. They may for example be applied to technologies for providing metallization levels without having to investigate the respective products, which may be manufactured by means of these technologies, for the tests.

In this technology segment, in particular, customers often call for "zero-defect requirements" as respective products may by all means concern safety-relevant aspects. A later exchange of respective defective components often involves very high cost so that zero-defect requirements often mean that the occurrence of errors after delivery of the product is highly undesired and may even be imposed with high contract penalties.

Frequently performed product tests in the area of the so-called front-end fabrication and the so-called backend fabrication often do not include any examination in view of extrinsic error sources. Here, the front-end area designates those fabrication phases, wherein the actual semiconductor structures of the integrated circuits are produced, whereas the backend area rather concerns the electrical contacting thereof.

Yield measurements often achieve no more than the detection of completely open or shorted components in electrical circuits of the final product. Thermal stress from burn-in tests often also do not provide any representative data, on the basis of which a product lifetime with respect to defects in the metallization may be assessed. Moreover, in the case of measurements on the final product, the statistical information relating to individual error sources is often not sufficient. Thus, weak vias may not be found with absolute certainty within the final product.

In the following, an integrated circuit according to an embodiment of the present invention, which represents a test structure or test chip comprising a plurality of cells with electrical elements and additional transistors for the electrical control thereof, will be described in closer detail in context of the FIGS. 1 to 10. The test structure comprises a plurality of vias, which are at least electrically connected up to form an array, as an example of electrical elements. A via is an electrical connection between two metal layers of an integrated circuit, for example. The cells and the test chip further comprise transistors and components for electrically coupling the vias and into a measurement setup.

The test structure described in the following therefore allows a high-sensitivity detection and characterization of deviations in the fabrication process of the vias, for example. In the following, the process block of the via fabrication has been chosen because these structures in particular may be a significant cause for malfunctions of the final product in the case of process errors or process deviations. The problem of weak vias and failures in the via area are commonly known and proven in practice.

In the following, sections of the present description, there is illustrated and described such a test structure or a test chip comprising, for example, 512·512, that is, 262144 individual vias arranged in a memory-chip-like array in one cell each. Each of the vias is individually addressable and measurable, for example, using a shift register, which will be explained in greater detail in the following.

It goes without saying that differing array sizes and non-square arrays may also be used. In the further course, the actual circuit technology, a possible layout as well as respective measurement routines and a measurement system according to embodiments of the present invention will be described.

If the array, for example, comprises more than 2z individual cells but not more than 2z+1 individual cells, z being a positive integer, which are arranged in 2n rows or lines and 2m columns, n and m also being integers, so that z is equal to the sum of n and m (z=n+m) it may be advisable, in some embodiments of the present invention, to keep rather close to a square shape of the array. It may therefore in such cases be advisable to choose n in the range between 0.3·z and 0.7·z or between 0.4·z and 0.6·z.

The array of cells may optionally also be geometrically arranged as such with respect to the surface of the substrate of the test chip. This is however not a mandatory prerequisite. It may therefore be advisable in some embodiments, for example, in the case of larger-scale electrical elements having a rather irregular geometrical form, to specifically not implement a strict geometrical array so as to save space on the substrate eventually.

An array of 512·512 individual vias may in any cases be regarded as a sufficiently large, statistically significant and representative random sample of the process block of the via fabrication, wherein the individual vias or larger groups of vias may be varied with regard to single ones or several ones of the parameters, for example. All vias of the array are individually addressable in the context of a 4-terminal measurement of the respective structure so that a realistic analog measurement of the resistances of the structures concerned and a possibly occurring drift thereof can be made possible.

Also integrated on the same chip of the integrated circuit is the above-mentioned periphery circuit, which allows measuring the Ohm's resistance or another electrical impedance value of the via connection. The 4-terminal measuring method here allows absolute resistance measurements near a static main distribution of an individual measurable structure or an individual electrical element. Furthermore, it may also allow a high resolution of a shifting of the resistance values in many cases.

In view of the process-related background and the process-related concept described above, the result is that electrical structures on a chip are created in a sequence of a multitude of individual process steps and individual processes during the processing. Each of these individual processes, due to tolerances in the fabrication systems, slight variations in the composition of the chemicals used and other random influences and disturbances, for example, are subject to a certain tolerance with respect to the process result. Thus, in production, the layer thickness of a deposited oxide typically varies around an actual target thickness in a specifiable tolerance range, to name but one example.

These fluctuations often also result in slight variations in the electrical performance of the electrical structures produced. The Ohm's resistance of a via connection, for example, varies around the target value in an again natural, specifiable tolerance range, which is permanently monitored during production.

If the process block of the via production is investigated by means of a representative random sample on the basis of a via test chip according to an embodiment of the present invention, there may be the possibility to investigate the potential effect of process variations on the electrical performance of the via (or any other electrical element). As the physical layout of the test chip according to an embodiment of the present invention may be freely designed, since the test chip is not employed in any application but for test purposes only, it may be possible to specifically simulate, as early as in the layout, variations to be expected in the whole course of the process. This may provide the possibility to "design in" and maybe even embody to a larger extent than would typically be the case in the context of the manufacturing process, such variations and disturbances. In other words, it may be possible, by exaggerating to arrive at and make detectable the effects of, an excessively critical range of parameters, which will, in real practice, be very improbable to occur.

In this manner, variations in the process may be simulated on the basis of a standard process of the production technology, without any intentional, test-related alterations of the fabrication process itself. Their effect on the electrical performance of the via or any other electrical elements may be measured and detected.

The test chip concept according to embodiments of the present invention therefore may make it possible, for example, to incorporate and design in process variations to be expected as fixed layout modifications in the form of a so-called derivate of the underlying reference layout. This makes it possible to use a special-purpose, customized test chip according to an embodiment of the present invention for each technology to be examined.

An exposure block, also referred to as an exposure mask or reticle, in some cases comprises 42 via test chips according to different embodiments of the present invention, for example. Moreover, same may further comprise an additional test structure with selected logic structures for a laboratory test in the case of malfunctions or for purposes of further development. In each exposure block, 3 reference layouts may be integrated without modification, for example, and may comprise 39 layouts with specific modifications, the so-called derivates. Other sizes of test chips may of course also be implemented as an embodiment of integrated circuits.

Possible derivates and arrays defined thereby may therefore exhibit modifications of the layout with respect to diverse parameters, for example. Arrays of the vias (or of other electrical elements) may therefore comprise single ones, some or all of the vias and contact levels of a design. Also, layouts or designs critical for the actual product may be picked out, such as individual vias, for example. What may also be picked out are layouts and designs critical for the production, as they may occur, for example, in the area of the overlay, that is, when various structures are disposed in spatial proximity of one another. Also, chain structures may be simulated in the context of arrays, or layouts and designs critical for the reliability of the future product may be used as electrical elements.

Therefore, in the case of vias, in different layouts and different designs, the via diameter, the via geometry, the via edge length, the nominal via overlap, a de-adjustment or maladjustment in a plane (x and y directions) of the first or second metal layers or other parameters may be modified in different ways.

It is to be noted here that it is not mandatory that respective modifications of the individual electrical elements be implemented. Depending on the specific electrical element used, completely different electrical elements having, in part, substantially deviating sizes may be employed, which, as the case may be, result in a substantially reduced variation variety as compared to that offered by a via structure. In such cases, it may be advisable to limit the number of different definitions for the electrical elements and structures so as to implement a sufficient number of elements for a sufficiently large statistical basis, for example.

As well be described in the further course of the description, reference chips without any variation with respect to a standard layout and derivates thereof may be specifically manufactured, measured and evaluated with known process modifications. This provides the possibility to test the impact of possible process variations of the standard processing. This may be employed in view of a reduction of high costs for intricate manufacturing tests by process modifications in the fabrication systems, for example. Furthermore, the use of an embodiment of the present invention may provide the possibility to accelerate the test process by means of parallelizing tests in the form of implementing a multitude of different derivates in an exposure block and therefore in a test chip, and therefore also accelerate the optimization process in chip fabrication.

For a characterization with respect to the quality, reproducibility and other parameters, the electrical resistance value or a comparable value such as an impedance value measured at a certain measuring frequency may be used for evaluation. Apart from vias, it is also advisable for many other purposes in the technology of the fabrication of integrated circuits to be able to individually measure a greater number of resistors or respective resistive elements on an integrated circuit. For this purpose, the resistors or electrical elements are arranged, according to an embodiment of the present invention, as individual cells in a cellular field in the form of two-dimensional or multi-dimensional arrays, at least electrically. The resistors are often arranged in a rectangular field in the form of rows and columns. Each of the resistors is associated with a control circuit having four transistors enabling, via one row and one column select line each, the selection of an individual resistor and its connection into a measurement arrangement. A cell of the cellular field therefore comprises a connection of the resistor to be measured with the control circuit having at least four transistors.

FIG. 1 shows a circuit diagram of a cell 100 having an electrical element 110 drawn in the form of a resistive element. The resistive element 110 exhibits a resistance value Rx in the representation chosen in FIG. 1. Moreover, the cell 100 comprises a first supply node 120 coupled to a first supply line 130 for a first supply potential or a first supply voltage. This may for example be a positive supply voltage VDD.

In addition, the cell 100 comprises a second supply node 140 coupled to a second supply line 150, which may, for example during the operation, be coupled to a reference potential, that is, for example, ground (GND), a negative supply potential or a negative supply voltage (VSS). If, for example, the second supply line 150 is coupled to ground, depending on a precise implementation, same will correspondingly be referred to as a ground connection.

Between the first supply node 120 and the second supply node 140 of the cell 100, a series connection of the electrical element 110, a first transistor 160 and a second transistor 170 is connected. For simplifying the illustration and the description of the mode of operation, the first and second transistors 160, 170 are drawn as switches in FIG. 1 and therefore therein designated with S1 and S2.

The two transistors 160 and 170 comprise two terminals each, the connections of which are closed or opened by the transistors 160, 170 depending on a control signal present at a control input of the respective transistors. If the transistors 160, 170 shown in FIG. 1 are field-effect transistors, for example, then the two connections, via which a current will flow from the first supply line 130 to the second supply line 150, in the case of a closed connection, will be a source terminal and a drain terminal. Accordingly, in this case, the control terminal is a gate terminal. In the case of a bipolar transistor, the two terminals, via which the actual current will flow, typically represent an emitter terminal and a collector terminal, whereas the control terminal is a basis terminal.

The control terminal of the first transistor 160 is coupled to a first control node 180 of the cell 100, which, in turn, is connected to a column select line 190. In contrast to that, the control terminal of the second transistor 170 is connected with a row select line 210 via a second control node 200 of the cell 100. Via the row select line 210 and the column select line 190, the cell 100 may be selected and activated via respective row select and column select signals by controlling the two transistors 160, 170. In this case, the associated electrical element 110 is coupled both to the first supply line 130 and the second supply line 150 via the two transistors. Via the row select line 210 and the column select line 190, a current may flow across the two supply lines 130 and 150 and across the electrical element via a first node 110a (not shown in FIG. 1) and a second node 110b (not shown in FIG. 1) of the electrical element 110.

The actual resistance value of the electrical element 110 is then determined according to the principle of the 4-terminal measurement by measuring a voltage drop across the electrical element 110. To couple the electrical element 110 into the 4-terminal measurement arrangement, which is sometimes also referred to as a two-wire measurement, the cell 100 further comprises a first output node 220 coupled to a first output line 230. Between the first output node 220 and the first node of the circuit element 110, there is coupled a third transistor 240, which is also shown in FIG. 1 as a switch S3. The third transistor 240 is with a respective control terminal coupled to the column select line 190, via the first control node 180 of the cell 100.

In addition, the cell 100 further comprises a second output node 250 coupled to a second output line 260. Between the second output node 250 and the second node of the electrical element 110, there is coupled a fourth transistor 270, which, in turn, is in a simplified manner shown as a switch S4 in FIG. 1. The fourth transistor 270 also has a control input coupled to the first control node 180 and the column select line 190. Therefore, the first transistor 160, the third transistor 240 and the fourth transistor 270 may be connected in parallel via a respective column select signal on the column select line 190. In contrast to that, the second transistor 170 is controlled via a respective row select signal on the row select line 210.

If a cell 100 is activated due to a respective column select signal and row select signal, a current, which will result in a voltage drop across the electrical element 110, will flow from the first supply line 130 to the second supply line 150 via the electrical element 110. As the third transistor 240 and the fourth transistor 270 are at the same time turned on by the column select signal, there will be present at the first output line 230 a first output potential V_outh and, at the second output line 260, a second output potential V_outl, the difference of which corresponds to the voltage drop across the electrical element 110 due to the flowing current. If these two potentials are voltages with respect to a reference potential, that is, with respect to ground, these are also referred to as row voltages.

Due to the connection of the two transistors 160, 170 with the electrical element 110 in the series connection, exactly one cell 100 each in the entire cellular field and the electrical element 110 included therein will be coupled to the supply voltage of the first supply line 130. For this reason, the current of the cellular-field supply is equal to the current through the resistor to be measured, i.e., the resistive element 110. The voltage drop across the resistor to be measured will then be present at the two output lines 230, 260 so that the resistance value of the resistive element 110 may be determined by measuring this voltage difference and the current of the cellular-field supply.

This way of measurement is insensitive to series resistors in the first supply line 130, the second supply line 150 (ground line), in the transistors 160, 170, 240 and 270 operating as switches, as typically, electrical voltages are externally measurable by the use of high-impedance measuring instruments so that, in good approximation, no current, which could result in an additional voltage drop, will flow across the third and fourth transistors 240, 270. Voltage drops of the first and second transistors 160, 170 will, however, in good approximation have no significance as the third and fourth transistors 240, 270 are connected.

In other words, embodiments of the present invention are based on the finding that a simpler and more specific investigation of influences on integrated circuits, their mode of operation or their fabrication may be performed by integrating a plurality of electrical elements to be investigated in the form of cells on an integrated circuit, which may specifically be electrically connected via transistors. This results in the possibility to investigate, in the context of an integrated circuit according to an embodiment of the present invention, a plurality of electrical elements in a fast and efficient manner so as to render parameter dependencies or geometry dependencies on properties and features of the electrical elements in question directly examinable, for example.

Figure 2:
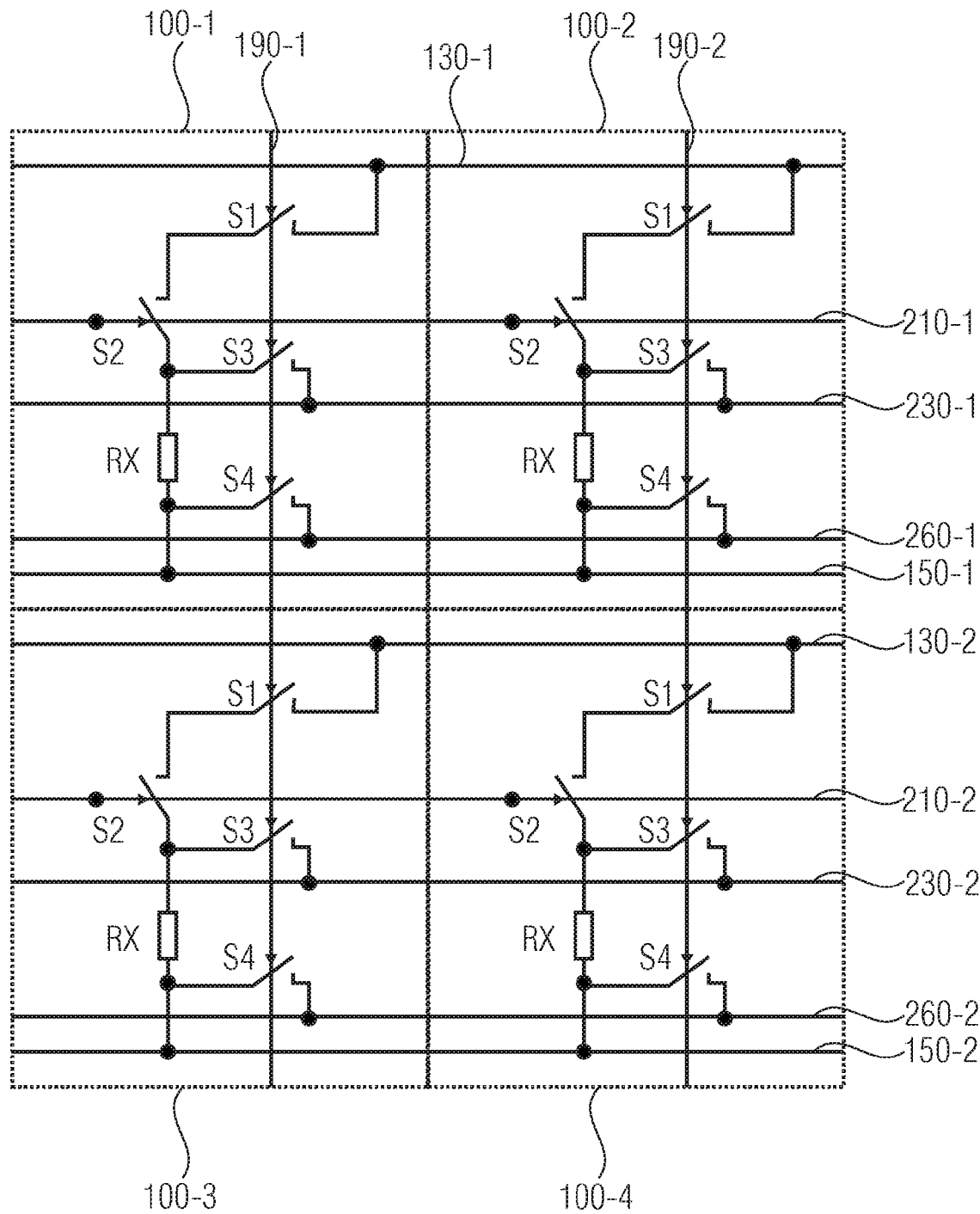
FIG. 2 shows a simplified circuit diagram having four connected cells according to an embodiment of the present invention.

FIG. 2 shows a cutout of a cellular field 280 having a total of four cells 100-1, 100-2, 100-3 and 100-4, which correspond to the cell 100 shown in FIG. 1 with respect to their internal connections. For this reason, here, reference is made to FIG. 1 with respect to their respective internal connections.

In addition, it may be noted here that, in the context of the present description, similar reference numerals are used for similar or equal functional elements, structures and objects so as to keep the description of the embodiments of the present invention as brief and curt as possible. For the same reason, description passages referring to a figure or an embodiment may be transferred to another embodiment or another figure, as can be seen from the similar reference numerals, unless explicitly stated otherwise. This also allows for a description that is more brief and curt and in particular avoids unnecessary repetitions.

Furthermore, in the course of the present invention, summarizing reference numerals will be used for structures occurring multiple times in an embodiment or in a similar manner in different figures and/or different embodiments. If, for example, general features of the cells 100-1, . . . , 100-4 are described in the context of FIG. 2, the summarizing reference numeral 100 will be used for single ones or all of the cells in question. Only if a certain element or a certain structure is described or referred to, the element-specific reference numeral will be used, that is, for example, the reference numeral 100-1 for the cell 100 depicted top left in FIG. 2. This also supports a briefer and curter description of the embodiments of the present invention.

Even if, as has already been discussed, the internal structure and the mode of operation of the individual cells 100 of the cellular field 280 correspond to the cell 100 shown in FIG. 1, same will still, however, be partly connected to different lines due to the two-dimensional arrangement of the individual cells 100 in the context of the cellular field 280. Thus, the two cells 100-1, 100-2 are coupled to a common first supply line 130-1 via their respective first supply nodes 120 (not shown in FIG. 2). Equally, these two cells are coupled to a common second supply line 150-1 via their respective second supply nodes 140 (not shown in FIG. 2).

This also applies to the further lines, running horizontally in FIG. 2. Thus, the two cells 100-1, 100-2 are also coupled via a common row select line 210-1, via a common first output line 230-1 and a common second output line 260-1. Accordingly, the two cells 100-3 and 100-4 are also each coupled to a common line each with respect to the lines running horizontally in FIG. 2. Thus, these two cells are coupled by their respective nodes described in the context of FIG. 1 via a common first supply line 130-2, a common second supply line 150-2, a common row select line 210-2, a common first output line 230-2, and a common second output line 260-2.

In contrast to that, however, the first cell 100-1 and the third cell 100-3 are coupled to a common column select line 190-1, running vertically in FIG. 2, whereas the second cell 100-2 and the fourth cell 100-4 of the cellular field 280 are coupled to a second column select line 190-2 via their respective first control nodes 180 (not explicitly designated in FIG. 2). In contrast to the column select lines 190, the row select lines 210 and the two output lines 230, 260, which are not directly interconnected with one another, the first supply lines 130-1 and 130-2 as well as the respective second supply lines 150-1 and 150-2 are coupled and/or connected to one another in an area of the cellular field 280 outside the area shown in FIG. 2.

In this context, it may further be noted that objects, structures and elements coupled to one another are to be regarded as ones electrically contacted to one another directly or indirectly via further circuit elements, objects or structures. Thus, the first transistor 160 and the electrical element 110 in FIG. 1 are indirectly coupled to each other via the second transistor 170, for example.

The first cell 100-1 and the second cell 100-2 are arranged, in the cellular field 280 shown in the form of a cutout in the FIG. 2, in one single row. This of course also applies to the third cell 100-3 and the fourth cell 100-4. In addition, the first cell 100-1 and the third cell 100-3 as well as the second cell 100-2 and the fourth cell 100-4 are each arranged in a common single column.

As, in a column selected by a corresponding selection signal via a column select line 190, all of the transistors drawn as switches S3 and S4 in FIG. 2 are connected to the respective output lines 230, 260 for the potentials V_outh and V_outl, it may be advisable, depending on the precise implementation, to implement an output multiplexer for the selection of an individual row and for forwarding the respective potentials or voltage, the multiplexer connecting only rows selected by means of the respective row selection signal to external connections of the test chip.

Figure 3:
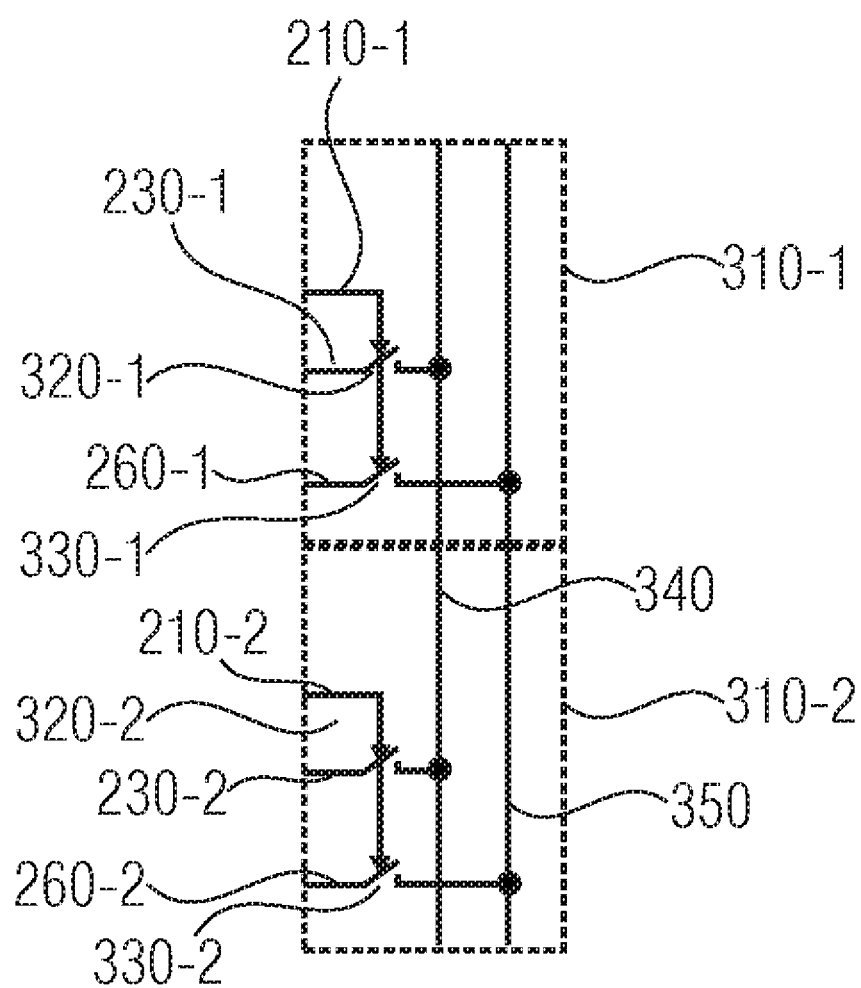
FIG. 3 shows a simplified circuit diagram of an output multiplexer having two multiplexer cells according to an embodiment of the present invention.

FIG. 3 shows a simplified circuit diagram of a multiplexer 300 having a first multiplexer cell 310-1 and a second multiplexer cell 310-2. Each of the two multiplexer cells 310 comprises a first multiplexer transistor 320 (or 320-1 for multiplexer cell 310-1 and 320-2 for multiplexer cell 310-2) and a second multiplexer transistor 330 (or 330-1 for multiplexer cell 310-1 and 330-2 for multiplexer cell 310-2). Each respective first multiplexer transistor 320 is connected between the first output line 230 and a first output connecting line 340, which couples the first output lines 230 to the external connection of the integrated circuit or test chip depending on the switching state of the first multiplexer transistors 320. Accordingly, each of the second multiplexer transistors 330 is coupled between the second output lines 260 and a second output connecting line 350 so as to enable, in operation, an electrical contacting of a second output line 260 to a second output connection of the integrated circuit or test chip.

The multiplexer transistors 320, 330 of a multiplexer cell 310 are each coupled to a row select line 210 associated with the respective row of cells 100. In other words, the control inputs of the two multiplexer transistors 320-1, 330-1 of the first multiplexer cell 310-1 are coupled to the row select line 310-1. Accordingly, the control connections of the multiplexer transistors 320-2, 330-2 of the multiplexer cell 310-2 are coupled to the row select line 210-2. Therefore, if the row select line 210-2 in FIG. 3 is, for example, the row i, where i is an integer designating the respective row, then row select line 210-2 corresponds to row (i+1). Accordingly, the first and second output lines 230, 260 will also be the two rows i and (i+1).

As will be explained in greater detail in the further course of this description, the first output connecting line 340 and the second output connecting line 350 connect the respective output lines 230, 260 to terminals or connections of the integrated circuit, at which the potentials or voltages V_H (via the first output connecting line 340) and V_L (via the second output connecting line 350) may be tapped and therefore detected during operation.

Figure 4:
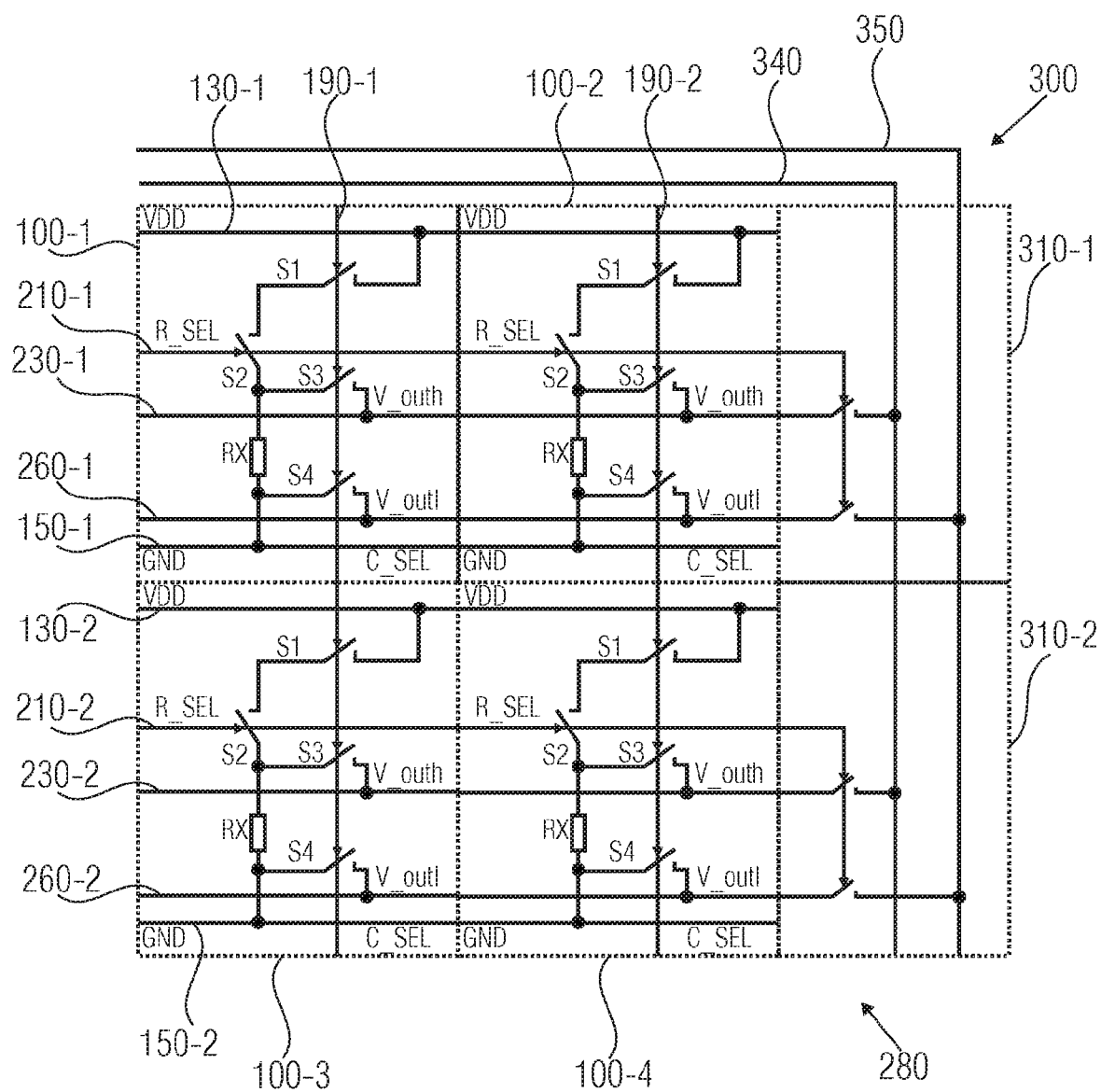
FIG. 4 shows a simplified circuit diagram having four cells and two multiplexer cells of an output multiplexer according to an embodiment of the present invention.

FIG. 4 shows a simplified schematic block diagram of the interconnection of the area of the cellular field 280 shown in FIG. 2 and that of the multiplexer 300. So as to avoid unnecessary repetitions at this point, reference is made to the description of the internal structure thereof. Apart from that, for maintaining the clarity of the representation in FIG. 4, the cross-cell lines as well as the respective cells and multiplexer cells only are provided with reference numerals. In addition, the signals, voltages and potentials in question, which may be applied to the corresponding lines, for example, during operation, are designated in FIG. 4. Thus, the first two supply lines 130 are provided with the abbreviation VDD typical for the positive supply voltage, whereas the second supply lines 150 are provided with the ones for ground (GND). The row select lines 210 therefore carry the row select signals R_SEL, whereas the column select lines 190 forward the column select signals C_SEL to the individual cells 100. The potentials of the two output lines 230, 260 are, again, designated with V_OUTH and V_OUTL in FIG. 4, in accordance with the designation in FIG. 1.

FIG. 4 illustrates that it is often advisable to implement as many multiplexer cells 310 as there are rows present in the respective cellular field 280. Depending on the precise implementation of an embodiment of the present invention in the form an integrated circuit, a test chip or an integrated test circuit, it may be advisable, for the measurement and determination of the current flowing through the respective activated electrical element 110, to provide the first supply lines 130 and the second supply lines 150 with their own positive and negative supply connections of the integrated circuit, in a manner separate from supply voltage connections of the peripheral circuit, which may also have to be implemented. Such an insulated supply of the first supply line 130 and the second supply line 150 makes it possible to determine the current resistance value of the electrical element 110 by means of determining the current flowing into the cellular field 280 and/or the respective activated cell 100 via the two supply lines 130 and 150.

In view of the control of the above-mentioned cellular field 280 it is further possible to freely address rows and columns by introducing a row decoder and column decoder, respectively. A respective row decoder or column decoder may, for example, be embodied as a part of an input multiplexer. So as to obtain optimum utilization of the possible row addresses column addresses, the cellular array or cellular field 280 described above may be laid out such that the numbers of rows and columns are powers of two. Thus, it is possible, for example, to implement 2m rows and 2n columns in embodiments of the present invention so that the number of rows are addressable with an address comprising m bits and the number of columns are addressable with an address comprising n bits. In this case, the two parameters n and m are positive integers. Varying numbers of rows and numbers of columns may of course also be implemented in embodiments of the present invention.

Figure 5:
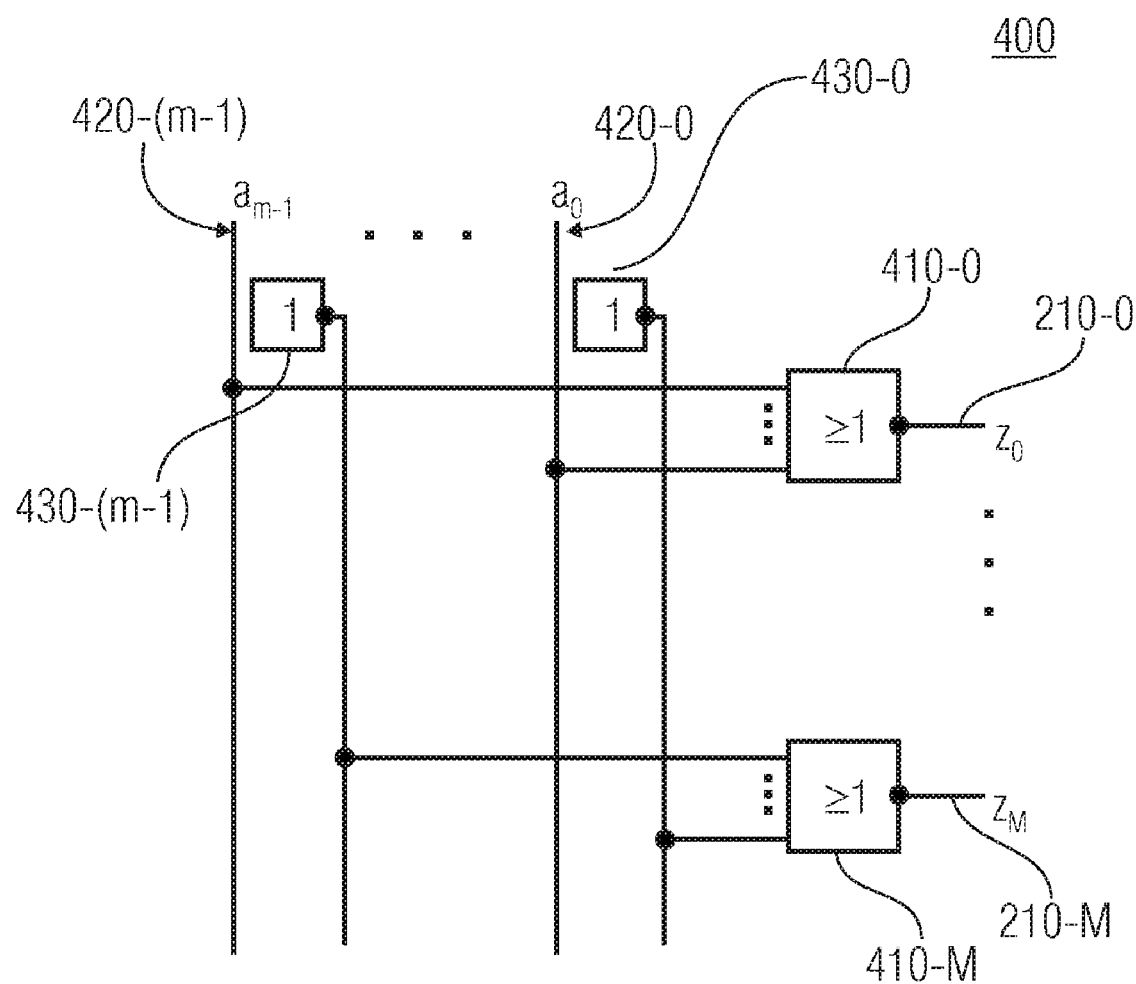
FIG. 5 shows a circuit diagram of an address decoder according to an embodiment of the present invention.

FIG. 5 shows a possible layout of a row decoder 400 as part of an address decoder for 2m rows on the basis of NOR gates 410. For a concrete implementation, 2m NOR gates 410 having m inputs each may be implemented. The row decoder 400 correspondingly comprises m terminals or connections 420 for address lines, on which a row index may be provided to the row decoder 400 in the form of a binary number so as to activate the row or row select line 210 in question by generating and outputting a respective row select signal on the respective row select line 210.

The connection for the address line 420-0, which is designated with the respective address bit a0 in FIG. 5, serves for receiving the least significant bit of the row index or row address. In contrast to that, the connection for the address line 420-(m−1) serves for receiving the most significant bit of the row address that is, the address bit am-1. In addition, each of the connections for the address lines 420 is coupled to an input of an inverter 430 providing, at an output of the inverter 430, an inversion of the respective bit of the row address arriving at the connection 420.

Thus, via the connections for the address lines 420, the address of the row to be activated, i.e., a number i of each row, may be provided to the row decoder 400 in the form of a binary number. Therefore, the addresses or row addresses i, in particular, may be represented in the range between 0 and M=2m−1 by means of the m address bits a0 to am-1.

In order to select a certain row, such as the row having the number i, a voltage V_SELROW(i) corresponding to a logic high level is applied to the respective row select line 210-*i*. On the basis of the binary-number representation of the row address, which is present at the connections for the address line 420 of the row decoder 400, this may be achieved in that, for each address bit ak, k being an integer in the range between 0 and m−1, indicating the number of the respective address bit having the logic value 1, the line in question is connected directly to an input of one of the NOR gates 410-*i* in question. For each address bit ak, which corresponds to the logic value 0, however, the line resulting on the basis of the inverter 430-*i* in question is connected to the input of the NOR gates 410, which results from the inversion of the address bit ak in question or from the inversion of the logic state of the line in question.

Thus, for example, the inputs of the NOR gate 410-0 are directly connected to the connections for the address lines 420 so that the respective direct address bit a0 to am-1 is provided thereto. Thus, in the case that in fact all address bits have a0= . . . =am-1=0, the row select signal z0=1 will be present at the respective row select line 210-0 at an output of the NOR gate 410-0. Accordingly, the inputs of the last NOR gate 410-M are all connected to the respective outputs of the inverters 430 so that, in the case that all address bits have a0= . . . =am-1=1, the row select signal zM=1 will be output to the row select line 210-M at the output of the NOR gate 410-M question (M=2m−1).

By means of this connection of the NOR gates 410 of the row decoder 400 it is possible to achieve the desired functionality on the basis of the row address present in binary-number representation, that is, on the basis of the address bits am-1 to a0 present at the connections for the address lines 420 (address inputs).

Figure 6:
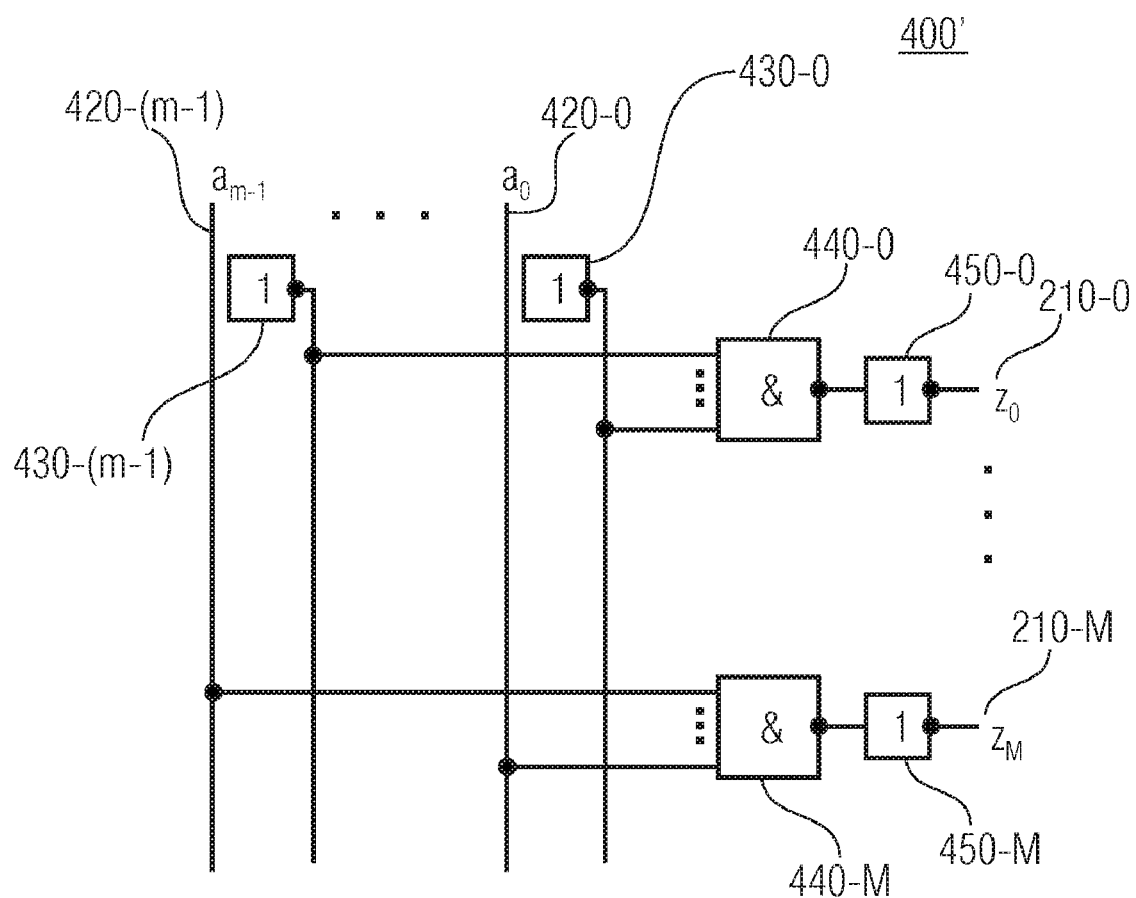
FIG. 6 shows a circuit diagram of a further address decoder according to an embodiment of the present invention.

FIG. 6 shows a further possible implementation of a row decoder 400' as part of an address decoder according to an embodiment of the present invention, which is again laid out for 2m rows but is based on the use of NAND gates. In this implementation of the row decoder 400', 2m NAND gates 440-0 to 440-M are again used for the 2m rows, each comprising m inputs. Again, m is an integer indicating the number of bits of the row address, and M=2m−1 represents the highest row number or row address.

The structure of the row decoder 400' in FIG. 6 is very similar to that of the row decoder 400 of FIG. 5. The row decoder 400' of FIG. 6 differs from the one in FIG. 5 basically with respect to three aspects. Apart from the fact that NOR gates 410 in FIG. 5 are replaced by NAND gates 440, the two row decoders 400, 400" differ with respect to the input connections of the NAND gates 440 as compared to the input connections of the NOR gates 410 of FIG. 5.

In the row decoder 400' of FIG. 6, each row is also addressed by a row address number i in the range between 0 and M=2m−1. Same is conveyed to the row decoder 400' in the form of a binary number having m bits, the address bits a0 to am-1 at the connections for the address lines 420. For each address bit k in the range between 0 and (m−1), which has the logic value 0, the line of the address bit ak in question is directly connected to a connection of the associated NAND gate 440-k. For each address bit ak with k in the range between 0 and (m−1), which has the logic value 1, however, the line resulting from the inversion of the respective address line 420 by the respective inverter 430 is connected to the respective input of the NAND gate 440-k. In contrast to the row decoder 400 shown in FIG. 5, the inputs of the NAND gates 440 are connected in an inverted or complimentary manner as compared to those of the NOR gates 410 of FIG. 4. Thus, for example, the inputs of the NAND gates 440-0 are for the row address 0 connected to the outputs of the inverters 430 of the associated address lines. Accordingly, the inputs of the NAND gate 440-M of the row with the highest address M=2m−1 are all directly coupled to the lines and/or connections for the address lines 420.

In addition, the row decoder 400' shown in FIG. 6 differs from the one shown in FIG. 5 also in that the row select lines 210 are not directly coupled to an output of the associated NAND gate 440 but are rather each coupled thereto via a further inverter 450. This makes it possible to again select a certain row via the respective row select line 210, that is, for example, select the row with the number i by applying a voltage V_SELOW(i) corresponding to a logic high level to the associated row select line 210-i. Due to the logic switching performance of the NAND gates 440, the inverters 450, themselves being coupled to the respective row select lines 220 will be required here. Other implementations of row decoders 400, 400' may of course be used, which may, for example, generate other voltage ratios at the row select lines. An implementation of individual ones or all of the inverters 430, 450 may also be omitted.

In operation, the row decoder 400' shown in FIG. 6 may also be provided with a row address in a representation in the form of a binary number with the address bits am-1, . . . , a0 at the address inputs 420 so that the row select line 210 corresponding to the row address will be controlled with a voltage value corresponding to a logic high state due to the connection of the NAND gates 440 and the downstream inverters 450 in the manner described above.

In view of the addressing of the columns, that is in view of the controlling of the column select lines 190, the row decoders described in the context of FIGS. 5 and 6 may of course also be used as column decoders. In other words, addressing columns of the individual cells 100 via the column select lines 190 may be performed in the same manner as addressing the rows. In the case of a column decoder, the row select lines 210 will be replaced by the respective column select lines 190, and the row select signals will be replaced by the respective column select signals. In addition, the respective NOR gates 410 or the respective NAND gates 440 are to be implemented with n inputs, if need be, so as to make the n different address lines addressable for the total of 2n different column select lines. Correspondingly, such column decoders frequently comprise 2n=N+1 NOR gates 410 or NAND gates 440, with N=2n−1.

By means of the implementation of the two transistors 160, 170 in the context of a cell 100 shown in connection with FIG. 1, a specific selection of a row 100 and its connection to the connection for the supply voltage for the cellular field 280 is made possible. This enables, via the connections for the supply voltage of the test chip, for example, a feed of a variable voltage, which is provided to the activated cell 100 only. As the description of the rows 100 in the context of the FIGS. 1 to 4 has shown, the individual rows are, however, addressed by their own row select lines. The implementation of the column select lines 190 and the implementation of the respective first control nodes 180 in the area of the cells 100, serves to achieve the above-mentioned decoupling of the supply line for the individual electrical elements 110 from the supply of the peripheral components. Ranking among same are, not least, the output multiplexer 300 as described in the context of the FIGS. 3 and 4 as well as an input multiplexer, which may, depending on the precise implementation, comprise, for example, a row decoder 400 as well as a column decoder having a similar structure as the row decoder 400.

Figure 7:
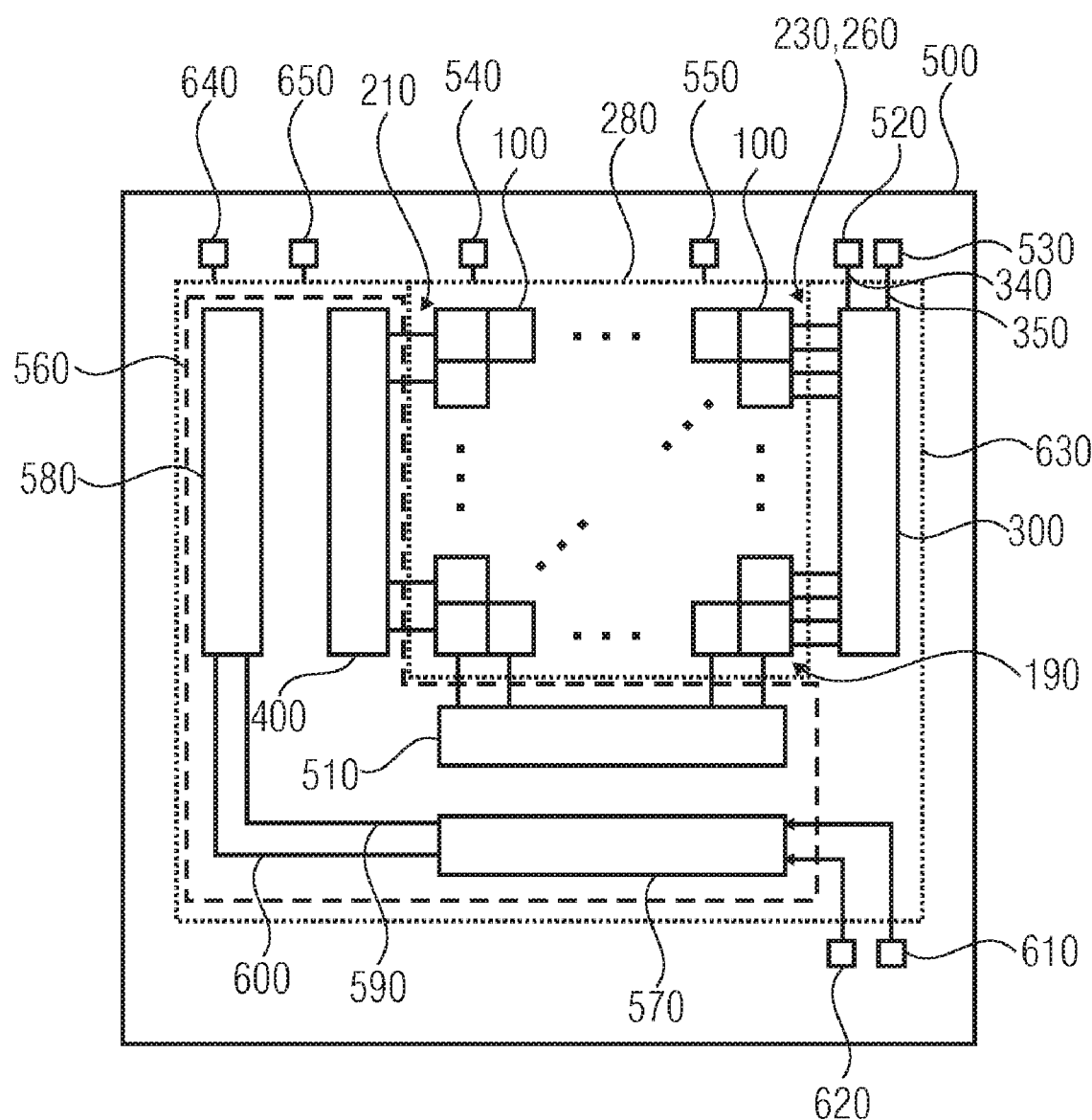
FIG. 7 shows a simplified block diagram of a test chip according to an embodiment of the present invention.

So as to illustrate this in more detail, FIG. 7 shows a block diagram of an integrated circuit according to an embodiment of the present invention in the form of a test chip 500. The test chip 500 comprises a cellular field 280 having a plurality of cells 100, only two of which are designated with a reference numeral in FIG. 7. The cellular field 280 is embodied in the form of an array having 2n rows and 2m columns.

The cells 100 of the cellular field 280 are coupled, via the row select lines 210, to a row decoder 400, which may be implemented, for example, as a NOR variant as represented in FIG. 5, or as a NAND variant as shown, for example, in FIG. 6. Accordingly, the test chip 500 further comprises a column decoder 510 coupled to the cells 100 of the cellular field 280 via the column select lines 190. It may also be implemented as a NOR or NAND variant, for example.

Via the first and second output lines 230, 260, the cells 100 are further coupled to an output multiplexer 300 which is, via the output routings 340, 350 coupled to first and second connections for the output voltage 520, 530. Therefore, at the first connection for the output voltage 520, the output voltage V_H of the activated electrical element of the activated cell 100 may be detected, for example. Accordingly, at the second connection for the output voltage 530, the output voltage V_L of the activated electrical element 110 of the activated cell 100 may be detected. For the purpose of simplifying the illustration of FIG. 7, the coupling of the row select lines 210 to the output multiplexer is not drawn in.

The test chip 500 further comprises a first supply connection 540 coupled to the first supply lines 130 of the cellular field and the first supply node 120 of the cells. Via this, the positive supply voltage VDD for the cellular field may be provided to the test chip 500 in operation. Accordingly, the test chip further comprises a second supply connection 550, analogously coupled to the second supply lines 150 of the cellular field 280 and the second supply node 140 of the cells 100. Via same, the cells 100 and/or the respective electrical elements 110 may be provided with a negative supply voltage of the cellular field or the reference potential (such as ground), respectively.

Apart from the output multiplexer 300, the test chip 500 further comprises an input multiplexer 560, which, in turn comprises the row decoder 400 and the column decoder 510. In addition, the input multiplexer 560 further comprises an m-bits comprising shift register 570 and n-bits comprising shift register 580 coupled to each other via a signal line 590 and a clock line 600. The two shift registers 570, 580 combine to form a shift register having a length of (n+m) bits.

In addition, the shift register 570, in accordance with the length of the shift register, has a length of m outputs, which are coupled to the connections for the address lines of the column decoder 510. Similarly, the shift register 580 has, in accordance with its length, n outputs, which are coupled to the connections for the address lines 420 of the row decoder 400. In addition, the shift register 570 is coupled to an address connection 610 and a clock connection 620 of the test chip 500. As will be explained in greater detail in the following, the two shift registers 570, 580 allow for serially entering the row address and the column address for the two decoders 400, 510 into the test chip 500.

In addition, the input multiplexer 560 forms, together with the output multiplexer and, as the case may be, further circuit components, which, for reasons of clarity are not illustrated in FIG. 7, the peripheral circuit 630, which serves for addressing the cells 100 and for reading the respective measured signals. The peripheral circuit 630 comprises, next to its voltage and current supply, two peripheral supply connections 640, 650, which may be provided thereto, for example, via a positive and a negative peripheral supply voltage.

The embodiment of the present invention shown in FIG. 7 in the form of the test chip 500 enables addressing a large number of rows and columns of the cellular field 280. In this case, what may occur is that the number of address bits to be transferred becomes so large that a parallel transfer via a multitude of address connections 610 might be rendered impractical. In other words, the number of address bits may become so large in some embodiments of the present invention that a direct parallel feed to the external chip connections might result in a substantial increase of the number of necessary connections so that same may become impractical. In such a case, there is the possibility to make the address of a cell 100 of the cellular field 280, which comprises one row address and one column address, serially available to the test chip 500 via a single one or several ones of the address connections 610. For this purpose, the two shift registers 570, 580 are present in the implementation shown in FIG. 7, into which the addresses may be inserted in a manner corresponding to a clock signal at the clock connection 620.

Due to the connection of the two shift registers 570, 580, as shown in FIG. 7, a solution in this case would be to read, via the address connection 610, first the row address and then the column address into the test chip 500. Due to the serial coupling of the two shift registers 570, 580, the complete address with the n bits of the row address and the m bits of the column address will be transferred into the associated shift registers 570, 580 in (n+m) clock cycles at the clock connection 620. By means of this, same are made available to the row decoder 400 and the column decoder 510 in a parallel manner. In the context of such an implementation, the total number of memory cells of the two shift registers 570, 580 should comprise at least the number of address bits of the row decoder 400 and the column decoder 510. If need be, same may also be larger so as to latch and provide to the test chip 500, further control information, redundancy information or other information, for example.

Depending on the precise implementation, it is possible that the two shift registers 570, 580 be permanently coupled to the connections for the address lines of the two decoders 400, 510. It is, however, also possible that same be transmitted to the column decoders not until an occurrence of a certain condition. This may be effected, for example, by introducing further inverters, NAND gates, NOR gates, or other logic gates between respective shift registers 570, 580 and the two decoders 400, 510. Such a condition may, for example, be effected by transferring the complete address, that is, by transferring (n+m) bits via the address connection 610. Therefore, one possible implementation may be to forward the bits stored in the shift registers 570, 580 to the decoders 400, 510 in question only every (n+m) clock cycles.

In other words, the test chip 500 may, for example, comprise further circuits enabling a specific deactivation or activation of one cell 100 of the cellular field 280. Apart from the above-mentioned counting of the clock cycles this may, for example, also be effected by transferring an activation signal to a further connection not shown in FIG. 7. In such a case, implementing a counting circuit for the clock cycles may be omitted.

It may be advisable to implement consistency measures for the address verification so as to make any misaddressing recognizable. There is the possibility, for example, in some few cells 100 in the entire cellular field 280 that have known positions and therefore known addresses, to omit or not implement the resistive elements or electrical elements 110. If a test pattern of the package in question is then performed, an interrupt instead of a resistance should be detected and measured if the test is executed correctly.

Figure 8:
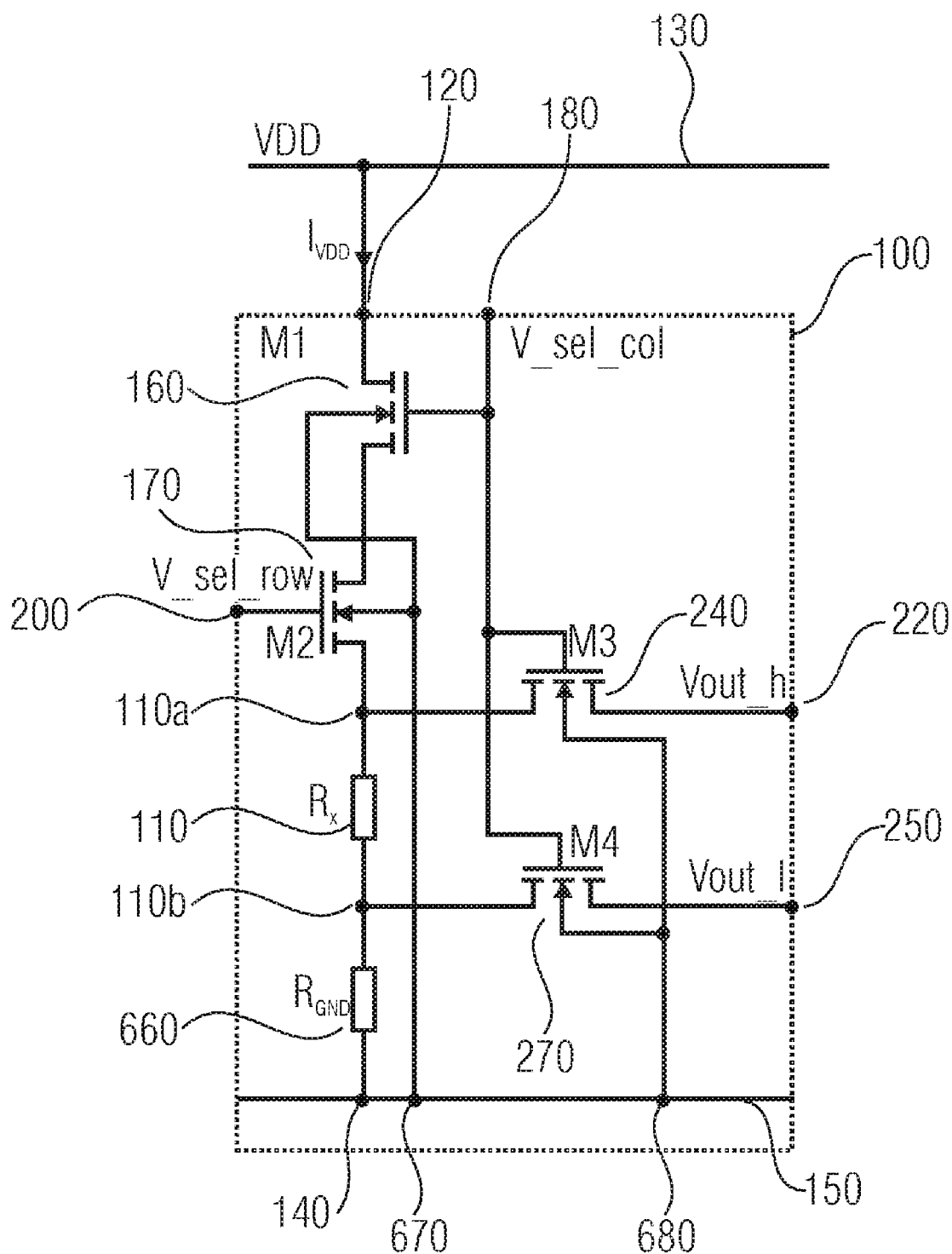
FIG. 8 shows a circuit diagram of a cell according to an embodiment of the present invention.

FIG. 8 shows a precise circuit realization of a cell 100 as has already schematically been shown using switches in FIG. 1. Due to the close similarity of the circuit realization of the cell 100 as shown in FIG. 8 and the simplifying representation of FIG. 1, reference is made to the respective description passages.

The cell 100 of FIG. 8 represents a 4-transistor cell for measuring small on-chip resistances by means of the 4-terminal measurement technique. It again comprises the four transistors 160 (M1), 170 (M2), 240 (M3) and 270 (M4), which are enhancement n-channel MOS field-effect transistors in the implementation illustrated in FIG. 8. In the circuit shown in FIG. 8, the electrical element 110 is the resistive element RX, the resistance value of which is to be measured or determined.

In many real implementations, it may be assumed that an unknown, parasitic resistor 660, also referred to as RGND in FIG. 8, is connected in series with the electrical element 110 to be measured. Its resistance value should, however, have no influence on the measurement result of the resistance value RX of the electrical element 110.

As has already been discussed at the beginning of the description of FIG. 8, the structure of the cell 100 of FIG. 8 substantially corresponds to the one of FIG. 1. Apart from the parasitic resistor 660, now being included into the series connection of the first supply node 120 and the second supply node 140, the cell 100 of FIG. 8 basically differs from the one of FIG. 1 by the replacement of the switches schematically shown in FIG. 1 by the respective transistors.

Thus, in the cell 100 shown in FIG. 8, a drain connection of the first transistor 160 is coupled to the first supply node 120, whereas a source connection of the transistor is coupled to a drain connection of the second transistor 170. A source connection of this second transistor 170 is coupled, via the electrical element 110 with its first and second nodes 110a, 110b as well as the parasitic resistance 660, to the second supply node 140. A gate connection of the second transistor 170 is coupled to the second control node 200. A gate connection of the first transistor 160 is, however, coupled to the first control node 180. Substrate connections of the first transistor 160 and the second transistor 170 are coupled to a reference potential node 670, which is connected to the second supply line 150, which is, in the present case, a ground connection.

A drain connection of the third transistor 240 is coupled to the first node 110a of the electrical element 110, and a source connection of this transistor is coupled to the first output node 220. Accordingly, a drain connection of the fourth transistor 270 is coupled to the second connection of the electrical element 110 and with a source connection coupled to the second output node 250 of the cell 100. The gate connections or control connections of these two transistors 240, 270 are also coupled to the first control node 180. The substrate connections of the two transistors are coupled to the second supply line 150 via a second reference potential node 680. The first supply line 130 is coupled to the first supply connection 540 (not shown in FIG. 7) so as to make it possible to provide, during operation of the test chip 500, a positive supply voltage VDD for the cellular field 280 and thus feed a current IVDD into the cell 100.

Measuring the resistance value RX of the electrical element 110 may now be effected by applying positive voltages with respect to the potential of the ground connection, that is, with respect to the second supply line 150, via the column select lines and row select lines in question. If the transistors 160, 170, 240, 270 are enhancement field-effect transistors, it is advisable to choose the voltages applied to the gate connections of the transistors substantially higher than the threshold voltage of the n-channel MOS field-effect transistors used.

This results in a current flow across the unknown resistance value RX to be determined of the electrical element 110, which is supplied with the supply voltage VDD by the first supply line 130. As has already been explained above in context of FIG. 1, the two n-channel MOS field-effect transistors 240, 270 serve to forward the potentials present at the connections 110a, 110b of the electrical element 110 to the two output connections 220, 250 to enable a measurement of the voltage via an (external) measurement unit.

As, typically, measurement units for voltage measurement, that is, voltmeters, multimeters or differential-voltage amplifiers, for example, meter voltages in a high-impedance manner, the current flow across the two output connections 220, 250 of the cell 100 is ideally infinitesimal, so that there will be no voltage drop at the third and fourth transistors 240, 270. Depending on the precise implementation of the cell 100, it may be advisable to choose the voltage conditions in the interior of the cell such, by means of choosing the supply voltage at the supply lines 130, 150 and the control voltages at the individual gate connections of the transistors 160, 170, 240, 270 such that the voltages at the two connections 110a, 110b of the electrical element 110 remain at least a threshold voltage of the two transistors 240, 270, which may, for example, be identically configured, above the voltage at the gate transistors of the two transistors.

A measurement of the resistance value of the electrical element 110 may be effected such that the current supplied by the supply voltage VDD is measured. This may, for example, be effected by means of measuring the current feed at the first supply connection 540 in the case of an external supply of the test chip 500. An external measurement unit may then be used to determine a difference of the two potentials at the two connections for the output voltages 520, 530 of the test chip 500 (V_OUTH and V_OUTL). The resistance value RX of the electrical resistive element 110 is then yielded as a quotient of the difference of the voltage values V_OUTH and V_OUTL and the current value IVDD according to $RX=(V\_OUTH-V\_OUTL)/IVDD.$ A variation of the current IVDD flowing through the cell 100 may, for example, be achieved by a variation of the control voltage or a variation of the voltage value, respectively, of the column select signal (V_sel_ROW). This makes it possible to control a voltage drop across the second transistor 170 of the cell 100, which will also result in controlling the current value IVDD through the electrical element 110. Similarly, the supply voltage externally fed to the cellular field 280 may of course also be controlled. In this way, a current-voltage characteristic curve of the electrical element 110 to be measured may be accommodated.

With particular respect to a physical realization of a cell 100 for the measurement of a resistance value of the connection of two metal layers, which is also referred to as a junction resistance, that is, for the measurement of the resistance value of a via as the electrical element 110 to be investigated, a very compact arrangement of the four transistors 160, 170, 240 and 270 may be implemented. A respective arrangement of these transistors may for example be realized such that the result is a continuous poly-silicon or metal conductive trace as the column select line 190 when the individual cells 100 are arranged vertically on top of each other, for example. If the cells 100 are arranged next to one another horizontally, it is possible to choose a design, where the lines running horizontally in the FIGS. 1 and 8 may also be implemented as continuously configured lines. These may, for example, be formed of a metal layer. These horizontally running lines, which are continuously embodied in metal, include the first supply line 130 for the supply voltage VDDCORE of the cellular field 280, for example. Also among same is the row select line 210, with respect to which the potential V_sel_ROW is fed to the transistors. The second supply line 150 which may, for example, serve as a cell-field ground GNDCORE, may also be embodied as such a continuously horizontally running line. The output lines 230, 260 implemented for the measurement voltages V_OUTH and V_OUTL may be implemented analogously. As a whole, an arrangement of an arbitrary number of cells in columns and rows is possible in the context of the space available for construction, the above-mentioned select lines 190, 210 enabling activating one single cell 100.

A connection between two metal layers disposed on top of each other, that is, a via, may be used as the electrical element 110 to be investigated, that is, the object of measurement. Same may be arranged such that the measurement current IVDD flows across this one via serving as the electrical element 110 only. Further implemented vias, as the case may be, may be arranged within the cell 100 such that it is exactly those that the current will not flow through so that their through resistance therefore has no bearing on or contribution to the measurable voltage drop at the electrical element 110.

Depending on the precise implementation of such a cell it may be advisable to perform the measurement of the voltage at the two output nodes 220, 250 of the cell in a high-impedance manner so as to also inhibit or minimize a parasitic current flow across further implemented vias, as the case may be. In such an implementation, one strip each from one of the two metal layers connected to the transistors 240, 270 may serve as measurement taps for tapping the voltage drop at the respective via. Thereby, they allow for forwarding the voltages to be measured to the external measurement unit via a connection to a low electrical resistance value.

As the preceding description has shown, the individual cells 100 may be configured in a very compact manner, depending on the electrical element 110 used. Thus, it is possible, in the case of small electrical elements 110 in the cellular field 280, to arrange these in the form of rows and columns of cells 100. This facilitates a measurement of a multitude of different electrical elements which may differ, for example, with respect to the parameters discussed in the introduction to this description. In addition, a larger number of electrical elements 110 also enables achieving a representative statistical distribution, which, in many cases, is a more suitable means for determining the efficiency of a process step than a single one or a few ones of the measurements.

Figure 9:
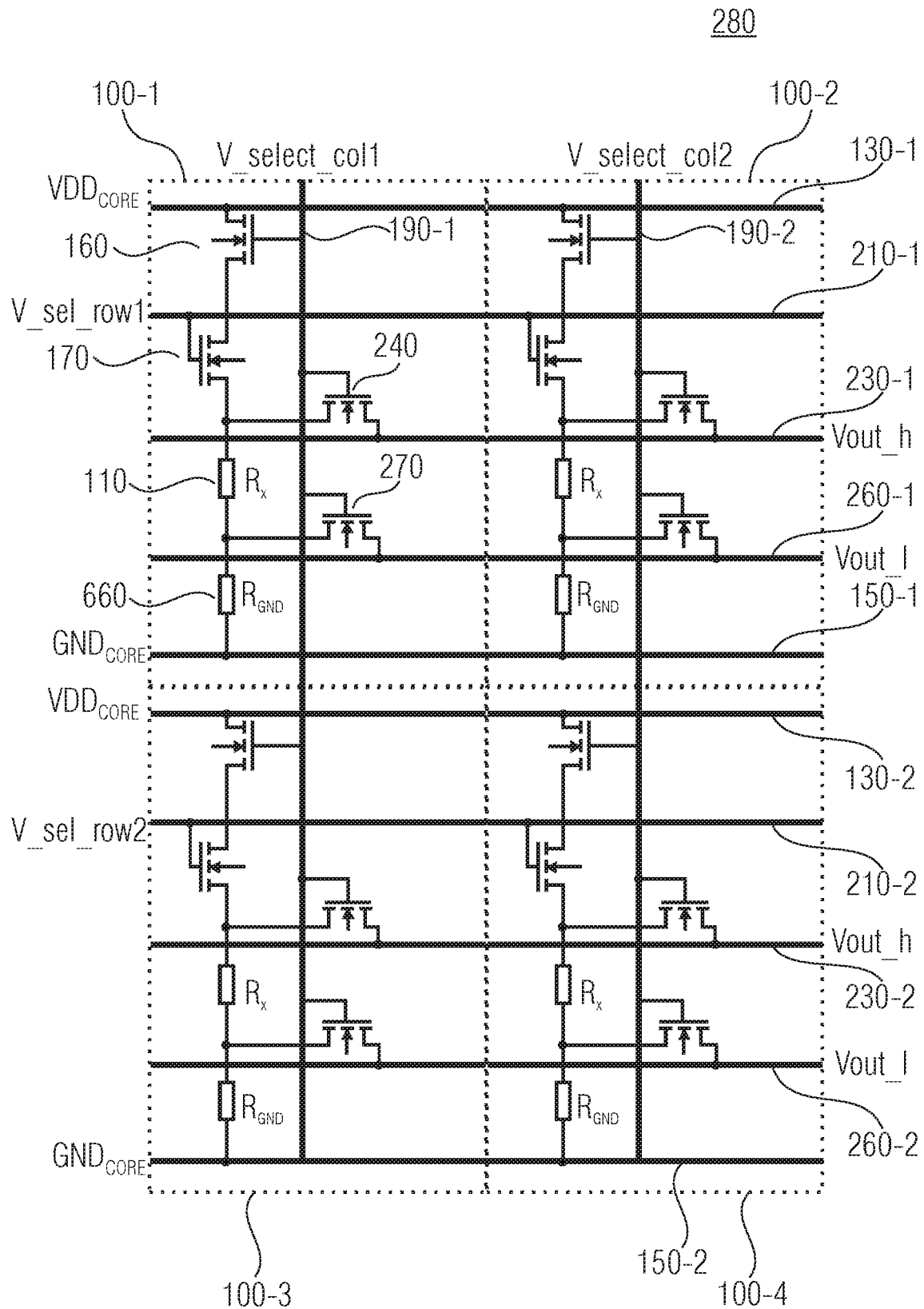
FIG. 9 shows a circuit diagram of a connection of four cells according to an embodiment of the present invention.

FIG. 9 shows an arrangement of cells 100 for the on-chip measurement of a field of resistors 110 based on the cells 100 shown in FIG. 8. More precisely, FIG. 9 shows a cutout of a cellular field 280 of the cells described above in a field consisting of two columns and two rows. A similar cellular field has already been described in closer detail with respect to FIG. 2, which is why, at this point, reference is made to the description in the context of FIG. 2 on the one hand and the description in the context of FIG. 8 on the other hand. For the clarity of the illustration of FIG. 9, the respective substrate connections of the transistors to the two reference potential nodes 670, 680 are not drawn in.

Thus, FIG. 9 shows four cells 100-1, 100-2, 100-3 and 100-4, each comprising the four transistors 160, 170, 240 and 270 described above. For reasons of clarity, same are designated in cell 100-1 only. Similarly, in cell 100-1, the electrical element 110, i.e., the resistor with the resistance value RX to be investigated, and the parasitic resistance 660 with the resistance value RGND are designated as such.

The cells 100-1 and 100-2 are coupled to the same first supply line 130-1, the same row select line 210-1, the same first and second output lines 230-1, 260-1 and the same second supply line 150-1. Analogously, the two cells 100-3 and 100-4 are also coupled to the same first supply line 130-2, the same row select line 210-2, the same first and second output lines 230-2, 260-2 and the same second supply line 150-2. In addition, the two cells 100-1 and 100-3 arranged adjacently in a manner vertical to each other are coupled to the same column select line 190-1. Accordingly, the two cells 100-2 and 100-4 arranged adjacently in a manner vertical to each other are coupled to the same column select line 190-2.

The gate connections of the above-mentioned transistors 160, 240 and 270 are also coupled to one another column-wise. By applying a positive voltage, with respect to the second supply line 150 serving as a ground connection, to one of the column select lines 190 in question, it may be achieved that only individual columns of the cellular field 280 will be active in each case. Depending on the precise implementation and layout of the transistors used, this may require the voltage applied to the column select line 190 to be substantially higher than the threshold voltage of the n-channel MOS field-effect transistors used. This may, for example, be advisable when same are implemented as enhancement field-effect transistors.

In such a case, the current can flow from the first supply line 130 for the supply voltage VDDCORE across one column only, due to the connection of the transistor 160. In addition, the above-described connection of the gate connections of the transistors 160, 240, 270 ensures that in each row, only one pair of transistors 240, 270 each is conducting and forwards the voltage value dropping at the electrical element 110, that is, the voltage to be measured, to the lines 230, 260. In order to be able to activate only exactly one column of the cellular field 280 in each case, it may be advisable to provide exactly one of the column select lines 190 with a corresponding column select signal.

The selection of a row is effected via the row select lines 210, which connect the gate connections of each of the second transistors 170 row-wise, in each case. So as to be able to measure only exactly one electrical element 110 at a time, it may be advisable to impart only one of the row select lines 210 with a positive voltage above the threshold voltage of the transistors used, in each case. The other second transistors 170 may then, for example, be connected to the reference potential, that is, to ground, for example.

The above-described condition for controlling the column select lines 190 and the row select lines 210 in turn ensures that only exactly one cell 100 is active in the entire cellular field 280. This means that a current will flow across one resistor to be measured only, that is, one electrical element 110, so that the current flowing across the first supply lines 130 is in total equal to the current across the resistor to be measured, as long as there are no leakage currents. In addition, in each row, only one cell 110 is connected to the output lines 230, 260 via its respective transistors 240, 270. So as to ultimately connect only one single pair of output lines 230, 260 to the respective output connecting lines 340, 350 leading to the external connections 520, 530, at which a measurement of the voltage difference is performed, it is advisable to implement an additional selector or multiplexer 300 as it has already been described in context of the FIGS. 3 and 4.

Depending on the precise implementation of a test chip 500 according to an embodiment of the present invention, it is possible, to use the row decoder 400 for feeding variable voltages into a cellular field. Thus, it may be desirable for different measurement purposes to realize a control of the current flowing across the electrical element 110 not by means of an external feed of a variable current but by a test chip-internal control. A technical realization may, for example, consist in applying variable voltages to the row select lines 210 of the cellular field 280. This serves to render a resistance value of the second transistor 170 in the active cell 110 controllable so that a voltage present at the series connection between the first and second supply nodes 120, 140 drops across at least the electrical element 110 and the controllable resistance value of the second transistor 170. For the multiplexer transistors 320, 330 of the output multiplexer 300, which are also connected to the row select line 210, this generally does not pose any problem as, due to the high-impedance voltage measurement, small currents at the most will flow across the resistance values of the multiplexer transistors 320, 330, which may also be increased.

This may be achieved by a slight modification of the row decoders 400 shown in FIGS. 5 and 6. In the following, in the context of FIG. 10, such a design of a row decoder 400, which may basically also be employed as a column decoder, is described in terms of a pure n-channel MOS enhancement circuit technology that is, on the basis of enhancement n-channel field-effect transistors.

Figure 10:
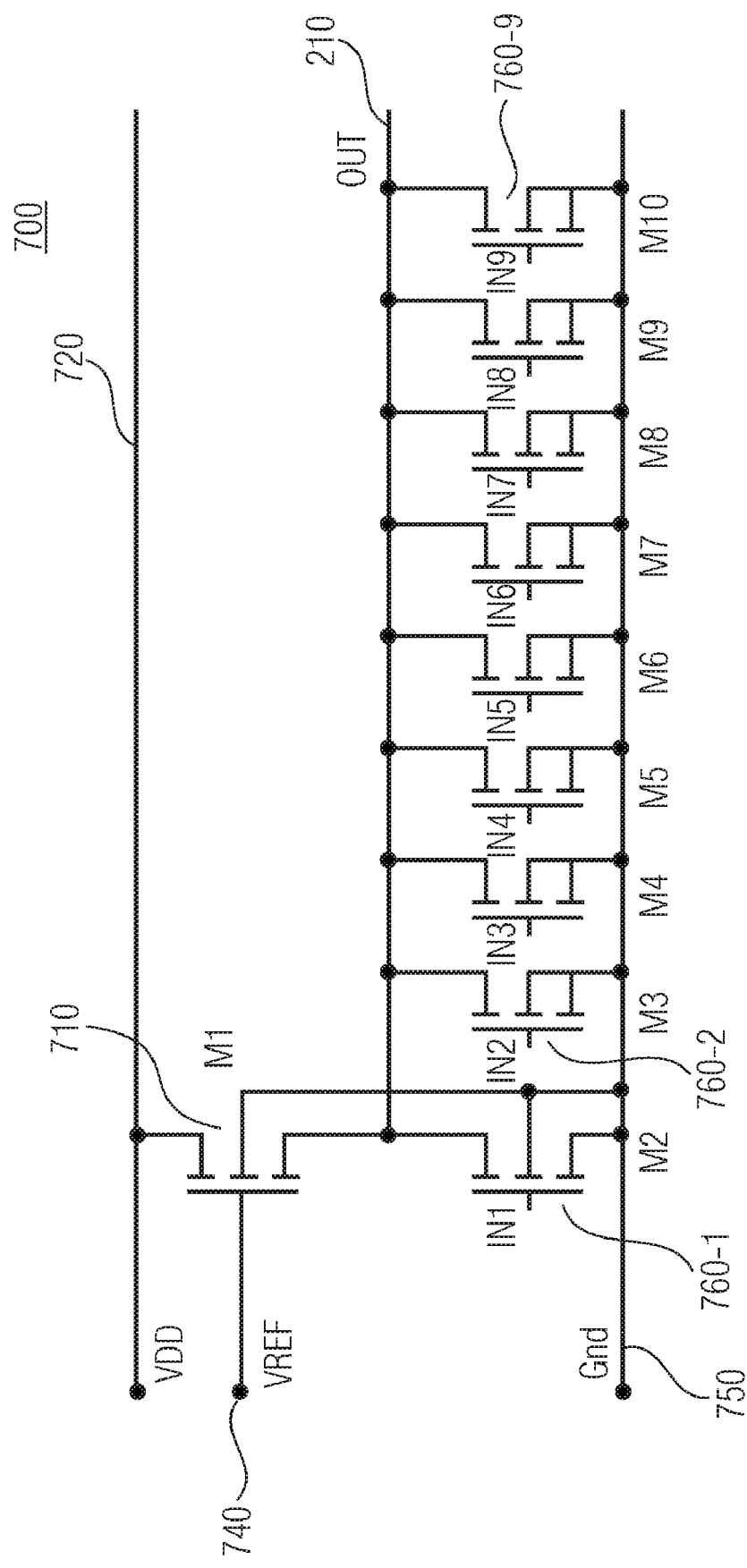
FIG. 10 shows a circuit diagram of a gate of an address decoder of an integrated circuit according to an embodiment of the present invention.

FIG. 10 thus shows a circuit 700, which may, for example, be implemented instead of the NOR gates 410 shown in FIG. 5. The circuit 700 comprises a first NMOS transistor 710 (M1) coupled, with a drain connection, to a supply line for a positive supply voltage VDD. The supply line 720 may, for example, be coupled to the peripheral supply connection 640 of the test chips 400 shown in FIG. 7.

A source connection of the first NMOS transistor 710 is coupled to a node 730, which, in turn, is connected to the row select line 210 in the context of the connection as a number decoder 400. This node is in FIG. 10 also designated with OUT. A gate connection of the first NMOS transistor 710 is coupled to a node 740 for a control signal or reference control potential VREF, which is coupled into the test chip 500 via a connection not shown in FIG. 7 for controlling the current made available to the cellular field 280, for example.

Between the node 730 and a connection for ground 750 (GND), there is connected a parallel connection of a plurality of second NMOS transistors 760-1 to 760-9. Same are also designated in FIG. 10 with M2 to M10. Each of the second NMOS transistors 760 is with a drain connection coupled to the node 730 and with a source connection coupled to ground 750. The gate connections of the second NMOS transistors 760 represent the inputs of the circuit 700 to which, in the case of the connection as NOR gates 410, the connections for address lines 420 or their inverted forms, respectively, are coupled, depending on the respective address of the row or column. In addition, the respective substrate connections of the second NMOS transistors 760 and of the first NMOS transistor 710 are coupled to ground 750.

The parallel connection of the second NMOS transistors 760 here forms the actual NOR gate, which is why same are also referred to as switching transistors. The first NMOS transistor 710 is operated, due to its control with the reference control potential via the node 740, by a corresponding reference voltage, which not least depends on the dimensioning of the transistors 710, 760, in a linear range of its characteristic curve and therefore functions as a controllable resistive element. For this reason, the first NMOS transistor 710 is in the context of the circuit also referred to as load transistor.

FIG. 10 therefore shows a circuit, which may replace a NOR gate 410 of the row decoder 400 of FIG. 5. The node 730, which is referred to in FIG. 10 as output OUT, is connected to the respective row select line 210. Same may only accept a voltage corresponding to a logic high level when all gate connections of the second NMOS transistors 760 serving as switching transistors are at a voltage of 0 V with respect to ground. Here, the first NMOS transistor 710 serving as a load transistor is dimensioned which such high impedance that a single one of the switching transistors 760, the gate connection of which is imparted with a voltage value corresponding to a high level, will pull the node 730 down to a voltage level corresponding to a low level. In other words, the switching transistors 760 as compared to the load transistor 710 are designed such that same are able to generate a low level.

If all of the second NMOS transistors 760 (switching transistors) are inhibited, the first NMOS transistor 710 functions as a source follower and feeds a voltage at the nodes 730 that lies, according to the gate-source voltage of the NMOS transistor 710 associated with the flowing current, below the voltage value VREF of the reference potential at the node 740.

The circuit 700 shown in FIG. 10 is of course not limited to the use in connection with 9 switching transistors 760. This principle is only exemplarily shown with 9 switching transistors and may be implemented without problem for any arbitrary number of switching transistors.

In addition, the NAND gates 440 of the row decoder 400' of FIG. 6 may of course be replaced by a variation of the circuit 700. In this case, the parallel connection of the second NMOS transistors 760 is to be replaced by a corresponding series connection thereof so that the switching transistors 760 in this case represent the actual NAND gate 440.

As has already been discussed at the beginning of this description, the embodiments of the present invention in the form of integrated circuits are not limited to electrical elements 110 in the form of vias or other resistive elements. More complex circuits up to entire assemblies and modules in the context of cells may be implemented. In addition, embodiments of the present invention in the form of integrated circuits are not limited to measurements in the DC domain. Basically, capacitive or inductive elements may also be employed as electrical elements 110 when the cellular field 280 is supplied with an AC signal having a measuring frequency, for example. Depending on the measuring frequency used, electrical elements having small impedance values of 100Ω and below may be measured. More complex circuits and units may also be employed as electrical elements 110, which may, with respect to two respective nodes 110a and 110b, have an arbitrary impedance course as a function of the measuring frequency.

The above-described embodiments of the present invention in the form of test chips 500 allow for an arbitrary addressing of the cells 100. In the embodiment shown in FIG. 7, this has been achieved by transmitting address values to the respective column and row detectors via the shift registers 570, 580. Alternatively, a respective addressing may also be effected by means of a parallel contacting of the column and row detectors as well as by a combination of the two above-mentioned methods, for example, by writing a plurality of address bits to the respective shift registers or memory cells in the context of small-scaled bursts.

Moreover, it is also possible to achieve a respective contacting of the cellular field in the context of an input multiplexer, even without any implementation of column and/or row decoders. This may, for example, be the case when basically all cells of the test chip 500 are to be considered, independent of the exact measurement method. Such an implementation may, for example, be effected on the basis of two shift registers, in which the respective row select lines and column select lines are directly coupled to the individual outputs of the memory cells of the shift registers. If, in the context of an initialization, a 1 is written to the first cell of each shift register, for example, whereas the remaining memory cells of the two shift registers are cleared, the logic 1 may be shifted through a first shift register or a first section of the shift register upon a clock signal. Thereby, a first row or a first column may be completely contacted by the logic 1 present, for example.

When the logic 1 has completely passed through the shift register or the section in question, the first shift register or the first section may be reinitialized and at the same time transmit a clock signal to the second shift register or a second section. Thereby, the second row or column of the cellular field may be connected to the respective output connections of the test chip 500. This implementation may be also be designed such that, as with the above-mentioned embodiments, exactly one row select line and one column select line at most are each simultaneously activated, as it is possible in the context of the embodiments described above.

Figure 11:
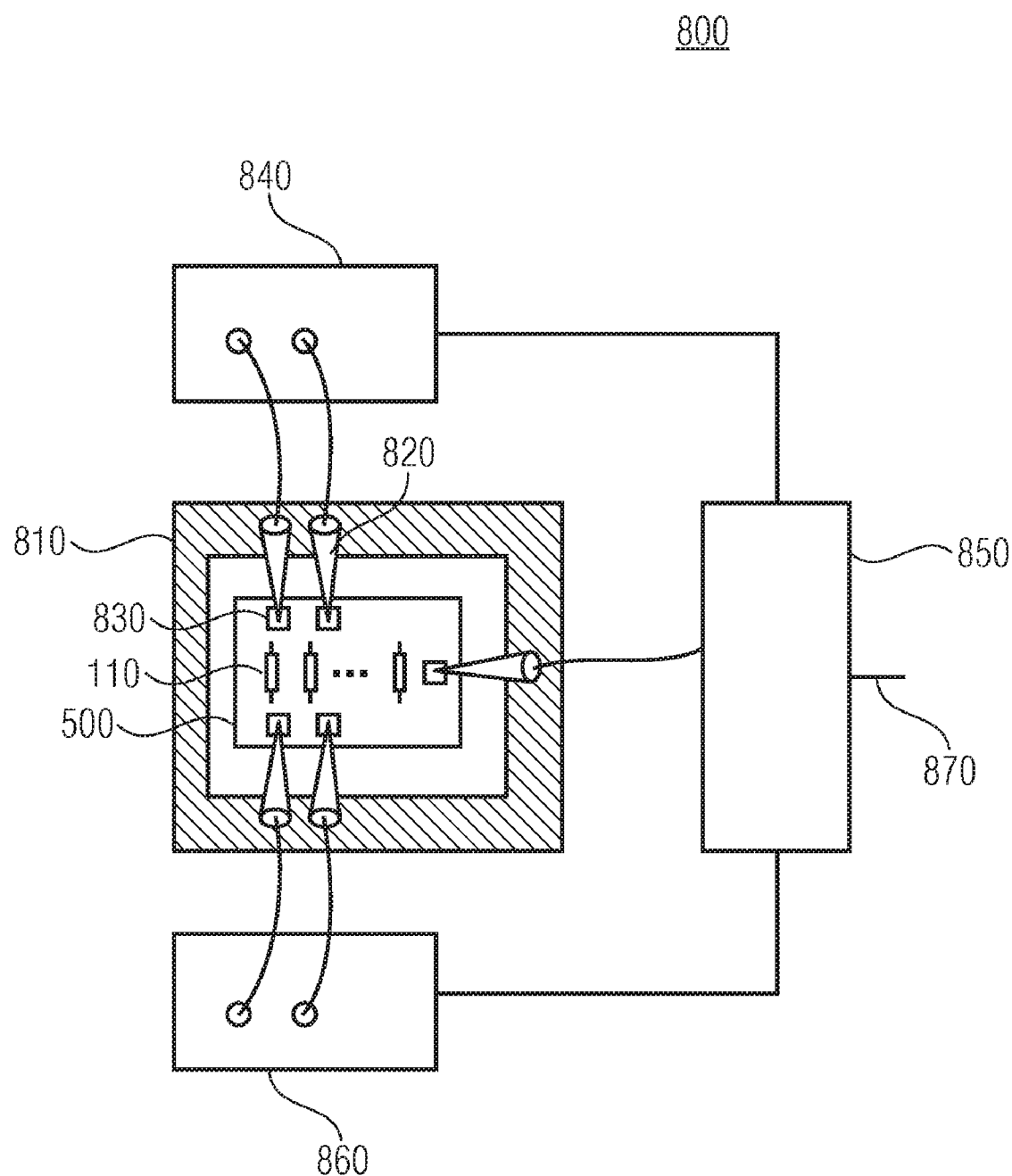
FIG. 11 shows a schematic block diagram of a measurement system according to an embodiment of the present invention.

Before embodiments of the present invention in the form of methods for measuring data, the evaluation and use thereof, are described in the further course of the present invention, first an embodiment of the present invention in the form of a measurement system is described in the context of FIG. 11. The test concept, which may be realized by means of embodiments of the present invention, allows for keeping the number of connections of the test chip 500 to be contacted from the exterior very small, for example by the use of serial address input. Depending on the precise implementation of test chips, the number of connections can be kept at substantially less than 10 connections, contact surfaces, bond pads or pads. These surfaces or lands serving for contacting frequently have an edge length of several 10 µm up to several 100 µm. Frequently occurring contact lands are square contact lands having a dimension of approximately 100 µm·100 µm. Same may as a rule be arbitrarily arranged on the test chip and/or the underlying substrate or wafer. It is thus possible to arrange them in a series. Depending on the precise implementation, the number of contact surfaces or connections may also be higher so as to enable connections for the supply and control of the peripheral circuits, for example. The number of connections may be in the range of around 20 connections or pads, for example.

The use of this concept allows both a control and a measurement using a few signals only, with the help of highly precise parameter testers according to embodiments of the present invention. The precision is promoted in that both a small number only of signals must be provided to the test chip 500 and a small number of signals only thereof must be detected.

In addition, embodiments of the present invention allow for performing an analysis under laboratory conditions, which is again promoted by the small number of signals. Under laboratory conditions, a contacting of a test chip may be performed with few measuring tips, as applying the measuring tips is often very critical and limited to few tips for reasons of space on the test chip.

By the use of semiconductor testers or wafer testers such as the TERADYNE J971, very fast measurement may be performed. As will be explained in greater detail in the further course, the measurement may first be performed in the context of a functional test, which compares the voltage drop at the electrical element 110 to be investigated to a fixed threshold. Only if the threshold is exceeded, a slower, parametric re-measurement for detecting the values with respect to current and the voltage dropping at the electrical element (device under test) may be performed according to embodiments of the present invention, if need be.

Next to the use of existing testers in the context of measurement systems according to an embodiment of the present invention, it is of course also possible to employ specialized test systems. The possibility of the use of testers, however, which are, for example, also used in production, illustrate the broad applicability and the possibility to also set the test systems up in a modular manner. Thus, these testers are frequently present in a sufficient number, are frequently serviced and calibrated according to ISO standards. There also exists a rich pool of experience with regard to the service personnel in view of programming and data processing with these systems. Thus, a production-related test in shifts, in particular, is enabled by means of measurement systems according to an embodiment of the present invention, for example.

FIG. 11 shows such a measurement system 800 according to an embodiment of the present invention. The measurement system 800 thus comprises an electrical contact unit 810 which facilitates, for example, by means of the use of contacting needles 820 a fast electrical contact to contact surfaces, connections or terminals 830 of a test chip 500 according to an embodiment of the present invention.

An electrical contact unit 810 may, for example, be realized using a semiconductor tester, a wafer tester, a wafer prober or another corresponding system, which enable a contacting of the test chip 500 without same having to be externally contacted, in the context of a bond process, for example.

The measurement system 800 further comprises a supply unit 840 coupled to the measurement system 800 so as to provide a current or voltage to respective connections 830 of the test chip 500. A controllable or controllable current source or voltage source, for example, my be concerned, which may be controlled by a control unit 850, for example. The supply unit 850 may comprise a voltmeter or an ampere meter, for example, which notifies a voltage present at the test chip 500 or a current of the control unit flowing there into. The connections 830, which are coupled to the supply unit 840 via the electrical contact unit 810, may, for example, be the first and second supply connections 540, 550 represented in FIG. 7, which serve for supplying the cellular field 280.

The measurement system 800 further comprises a measurement unit 860 coupled both to the control unit 850 and to the electrical contacting unit 810. The electrical contacting unit 810 is configured such that it enables the measurement unit 860 to measure a voltage at the two terminals for the output voltage 520, 530 of the test chip 500. The measurement unit 860 may be a voltmeter, an electrometer or another unit for measuring and detecting voltages, for example. Via the coupling of the measurement unit 860 to the control unit 850, the measured values of the voltage may be transmitted to the control unit 850. Finally, the control unit 850 is itself coupled to the electrical contacting 810 so as to transmit, via the respective contact needle 820, respective electrical address signals and clock signals to the address connection 610 and the clock connection 620, as the case may be, of the test chip 500 so as to be able to select and activate a cell 100 and/or the electrical elements 110 included therein.

In addition, as will be described in the further course of the description, the control unit 850 also serves for storing and, if need be, assessing and evaluating the measured quantities detected. The same may, as the case may be, be transferred to an external storage medium, an internal storage medium or another computer, processor or production facility via a respective connection 870.

Both complete systems and modular systems may be used as measurement systems 800. The components shown individually in FIG. 11 may also, as the case may be, be realized as stand-alone components, circuits and units or be implemented in the form of one or several apparatuses comprising more than one of the units mentioned. It is therefore possible to implement a measurement system 800 according to an embodiment of the present invention that is based on a semiconductor tester TERADYNE J971. An adaptation between the test chip 500 (device under test) and the tester used may in such a case be realized on the basis of the standards applying to the semiconductor tester in question by means of a needle card having a corresponding number of needles (such as 20 needles).

In the case of a use of such a semiconductor test, it may in addition also be advisable to use an instrumentation amplifier in a respective connection in the context of the measurement unit 860 so as to be able to better detect the very small voltage drop occurring at a via as an electrical element 110 by raising or amplifying same by a factor 100 or by another factor relative to the level, for example. Depending on the precise implementation of the semiconductor tester any other basic systems used, the use of an instrumentation amplifier or an alternative circuit may be advisable also on the account that a differential-voltage measurement at the two connections 520, 530 of the test chip 500 might not be realizable without the help of such a separating device.

Therefore, measurement units for the measurement of voltages sometimes have internal connections, which might enable them to carry out voltage measurements with respect to ground only. While such a method is no obstacle for many applications, which is why respective testers often use such connections, the result with measurements of very small voltage differences may, however, be that same are, with respect to a possibly larger background voltage, resolved with a lower resolution and may even be completely swallowed up by this signal.

In the case of measurement systems 800 operating on the basis of alternating currents or AC voltages, respective AC-suitable current sources, voltage sources, multimeters, voltmeters, ampere meters and electrometers as well as frequency analyzers and network analyzers may also be employed as the supply unit 840 and the measurement unit 860, depending on the frequency domain. The measuring frequencies may thus range from the DC domain up into the gigahertz domain of several 10 GHz and more.

Depending on the precise implementation, the electrical contact unit 810 may not be designed for the accommodation of a single test chip 500 only but for the accommodation of a plurality of test chips. This may for example be realized such that the electrical contact unit comprises motors or actors enabling mechanical moving of the contact needles. Thus, a plurality of the test chips may be measured and investigated without dicing them from a wafer. Here, the test methods discussed in the further course of the description may be performed for each single test chip on the wafer 500, for example, before the next test chip 500 is approached in the context of moving the wafer or the contact needles of the electrical contact unit.

In the following, methods for data acquisition and/or data measurement and test programs according to embodiments of the present invention will be described, which may be implemented by means of integrated circuits 500 and measurement systems 800 according to embodiments of the present invention.

Figure 12:
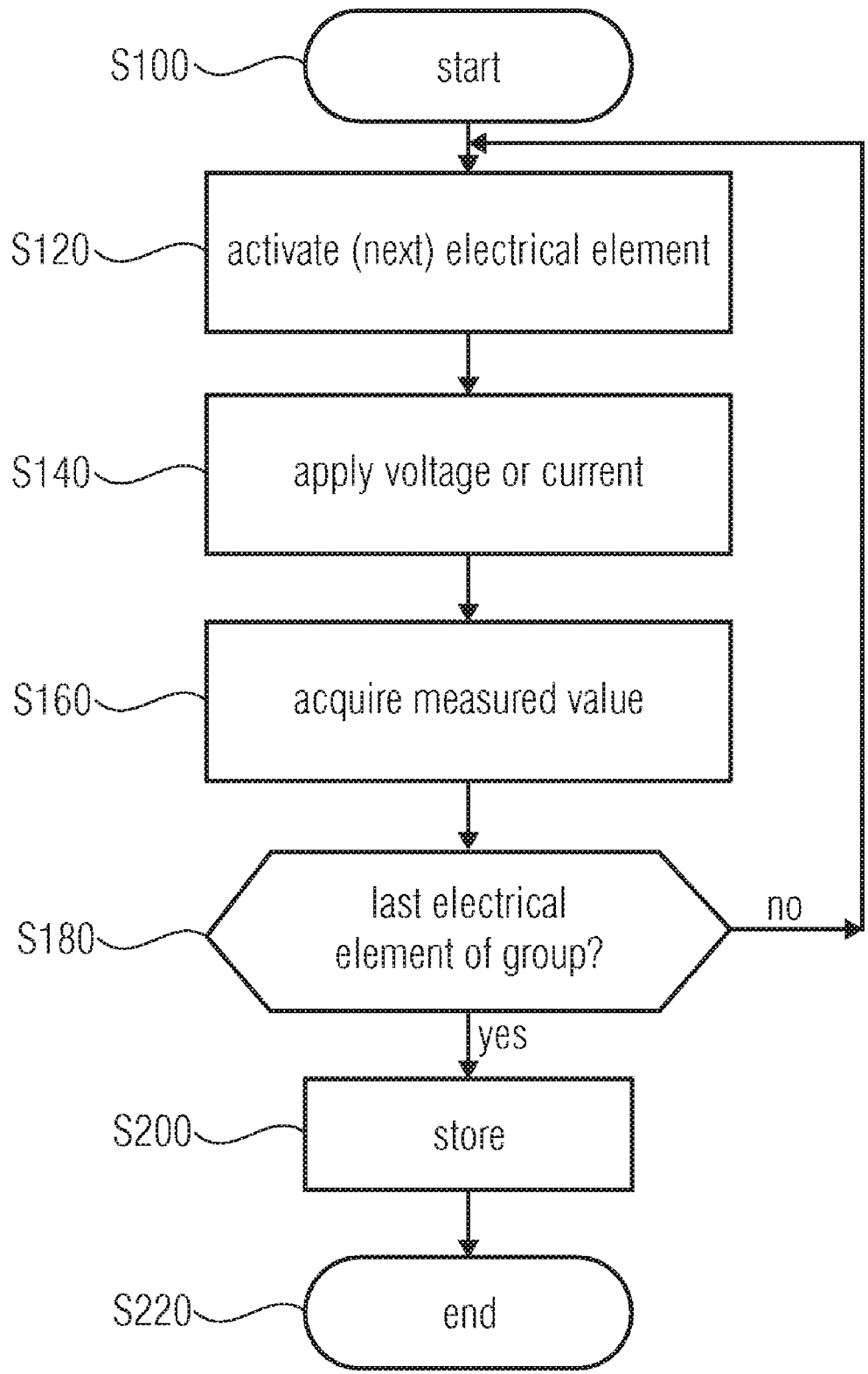
FIG. 12 shows a flow chart of a method for acquiring data according to an embodiment of the present invention.

FIG. 12 shows a flow chart of a method for acquiring data according to a first embodiment of the present invention. After a start of the method in step S100, first an electrical element 110 of the test chip 500 is activated in a step S120. This may be effected, for example, by transferring address information in the form address signals to the test chip 500 by means of the control unit 850. Depending on the precise implementation of the test chip 500 and the associated measurement system 800, a respective activation may also include providing a further signal such as an activation signal.

In a step S140, a voltage or a current is then provided to the cellular field 280 of the test chip 500 by means of the supply unit 840. Depending on the precise implementation of a measurement system according to an embodiment of the present invention, this may be effected by transferring a command from the control unit 850 to the supply unit 840, by providing the supply voltage VDD for the cellular field 280 of the test chip 500, or by providing a control voltage at a respective connection, which is, e.g., connected to the node 740 for the reference potential in the context of the row decoder 400, for example.

By activating the electrical element 110 of a cell 100, a measured value may be acquired by the measurement unit 860 or by the control unit 850 via the measurement unit 860, respectively, in a step S160. This value may be temporarily stored in a respective latch, for example.

In a next step S180, a verification is made as to whether the element last activated was a last one of a group of electrical elements 110, which are to be investigated in the context of the test program or measurement program running. If this is not the case, a return is made to step S120, and the next electrical element of the group is activated.

Depending on the precise implementation, this may require, as an optional intermediate step, that the electrical element previously activated be deactivated, by a respective activation signal no longer being provided to the test chip 500, for example. Similarly, this may require deactivating the voltage or current applied, as the case may be. Similarly, the activation of the next electrical element 110 may result in an implicit deactivation of the previously activated electrical element 110, which may optionally be performed simultaneously, for example when the previously activated element 110 is automatically deactivated by transferring the next address. Apart from that, the group of electrical elements also comprises a list, for example, of electrical elements 110 to be investigated and measured in the context of the test program or measurement program.

If, however, it has been determined, in the context of the step S180, that the last electrical element of the group was measured, at least a measured value, a value derived there from, or status information based on one of the measured values, is stored on a respective storage medium in the context of a step S200, before the method is ended in step S220. Thus, in the context of step S200, the actually measured value may be stored together with the previously applied or acquired current in the context of a file (such as a log file) providing information on at least one measurement result, for example.

Similarly, a value derived from at least one measured value, for example, may be stored, which may be the electrical resistance value of at least one electrical element 110 of the group of electrical elements, for example. As has already been discussed in the context of embodiments of the present invention in the form of integrated circuits and test chips 500, the electrical resistance value may be obtained by means of the division of the voltage dropping at and the current flowing through the electrical element 110. Other electrical quantities or values derived there from, such as capacitance values, phase positions or other impedance-related values, may of course also be stored in the context of respective files.

The group of electrical elements 110 may be determined, defined or read on the basis of a programming or on the basis of corresponding layout data in the context of an optional step prior to the first activation of an electrical element 110. Same may comprise, for example, an address list of the cells 100 in question, or a list of designations of the electrical elements. The group or list may then be stored in the context of the control program or a parameter file, which is accessed by the control unit 850.

Figure 13:
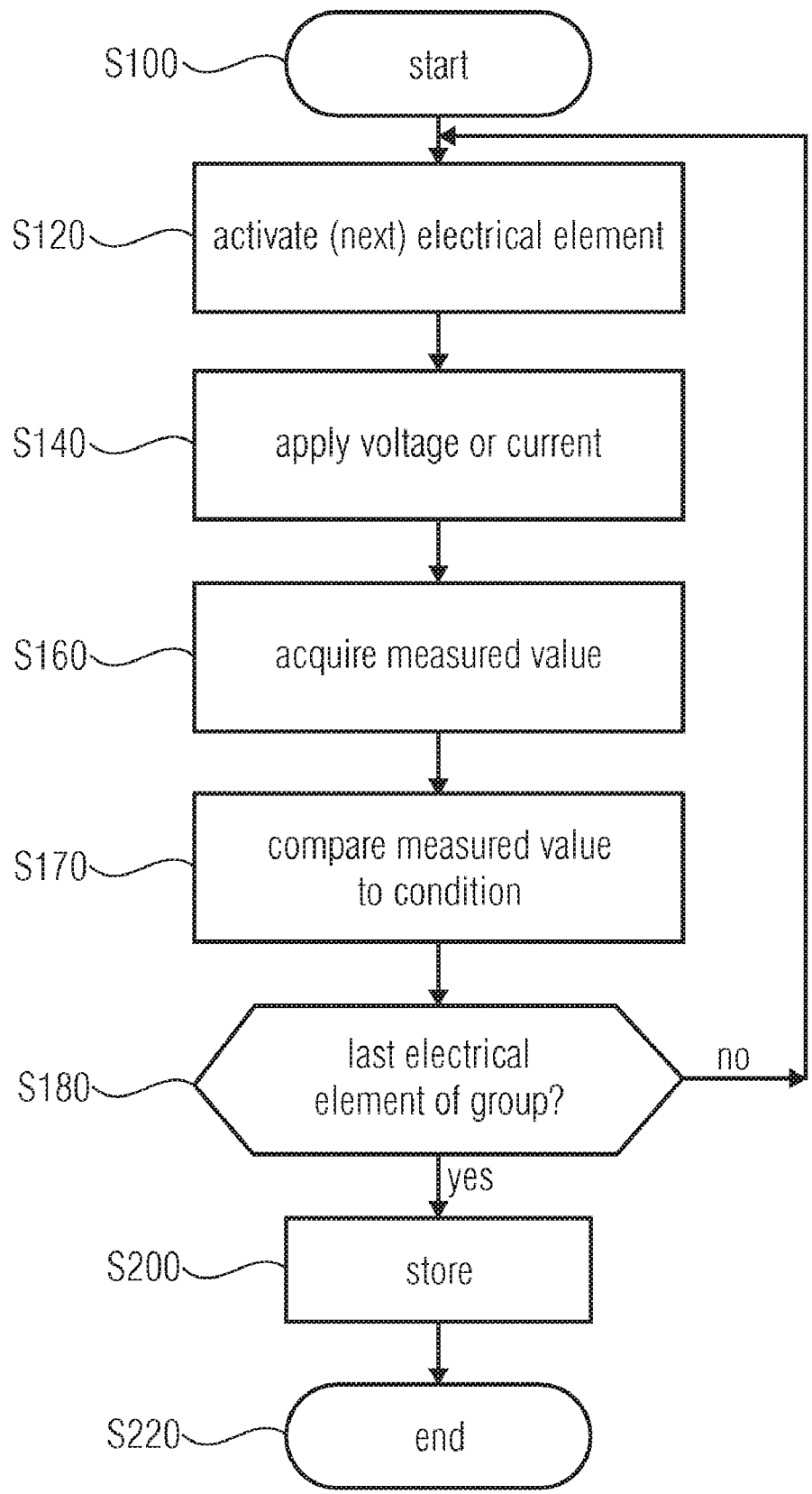
FIG. 13 shows a flow chart of a method for acquiring data according to a further embodiment of the present invention.

FIG. 13 shows a flow chart of a further method for acquiring data according to an embodiment of the present invention, which differs from the flow chart shown in FIG. 12 only in that between the step S160 of acquiring measurement data and the verification of step S180 as to whether the electrical element activated is the last one of a group, a step S170 is performed, wherein, for example by means of the control unit 850 or the measurement unit 860, the measured value acquired is verified as to whether same fulfills a condition. If a test method for characterizing electrical resistive elements, that is, for example, for characterizing the conductivity of vias, is concerned, for example, a current may be applied to the electrical element 110 in question in step S140, the current resulting in a voltage drop being detected in step S160. Same may verified in step S170 as to whether, based on the current provided to the electrical element 110, the voltage drop measured is above or below a threshold value. If, for example, the measured value is above a correspondingly defined, programmable or adjustable threshold value, this may be an indication that the via structure in question is defective or "weak". In such a case, it could, as an electrical element 110, not fulfill the condition, for example. On the other hand, in other electrical elements, undershooting a respective threshold value may be an indication of a short or another defect such as a leakage current, so that, in this case, undershooting the threshold value is assessed as not fulfilling the condition.

Due to the non-fulfillment of the verified condition in step S170, status information, together with, if need be, the respective address information on the electrical element 110, may in step S200 be stored in a memory, such as a hard drive, a non-volatile memory or another storage medium. The data stored such may be further used in the context of a defect analysis, for example.

Figure 14:
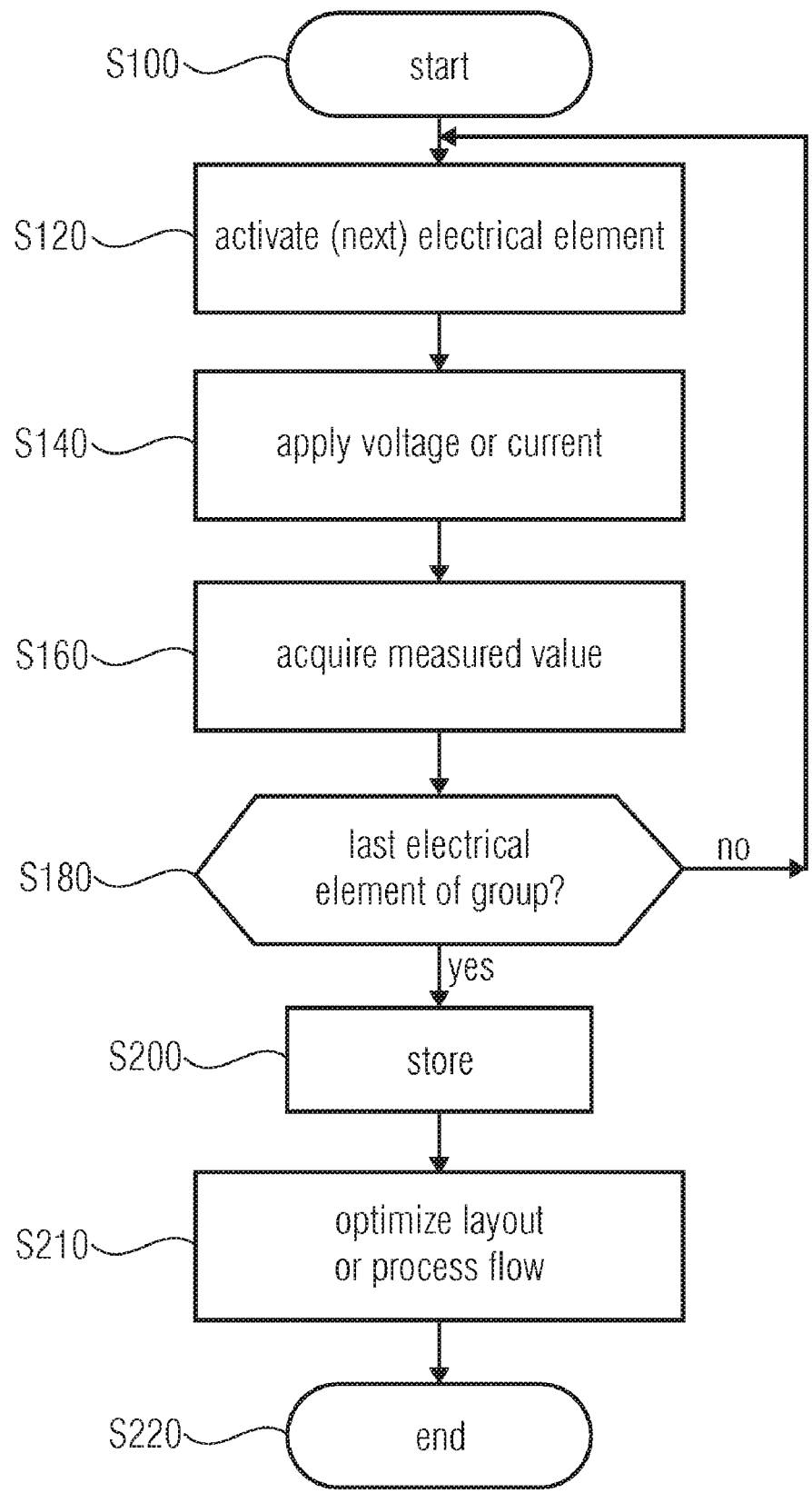
FIG. 14 shows a flow chart of a method according to an embodiment of the present invention.

FIG. 14 shows a further embodiment of the present invention in the form of a method for acquiring data. The flow chart shown in FIG. 14 differs from the one illustrated in FIG. 12 only in that a step S210 of optimizing a layout or a process flow for the fabrication of a respective electrical element is performed between the steps of storing in step S200 and ending the method in step S220.

Such optimization of a layout or a process flow may, for example, be performed in that the measured values, values or status information stored in step S200 are analyzed as to which of them have good values with respect to the specific requirements of the product in question. Then, based on an original layout or an original process flow, the associated design parameters or process parameters may be incorporated into the new, optimized layout or the new, optimized process flow in accordance with the electrical elements 110 identified as the optimum ones.

If, for example, the electrical elements 110 are vias having been characterized in view of their electrical resistance values, a particularly reliable via design may be identified on the basis of the measured data, which is then incorporated, in the context of the step S210, on the basis of a statistical frequency of occurrence, for example, into the original layout to improve the total design of the process. Such a statistical analysis and a respective exchange may be performed in a fully automated manner on the basis of numerical methods, for example.

If, for example, the electrical elements are an electrical capacitors such as trench capacitors having deposited insulating layers between their connections which, on the test chip 500, differ in view of process parameters in the deposition of the insulating layer, for example, the capacitors fulfilling a condition may be identified on the basis of the previously recorded measured values and their fabrication parameters may be incorporated into the process flow. Here, the matter of concern may be a capacitance value at a certain measuring frequency, which allows conclusions to possible short circuits and capacitance values.

Figure 15:
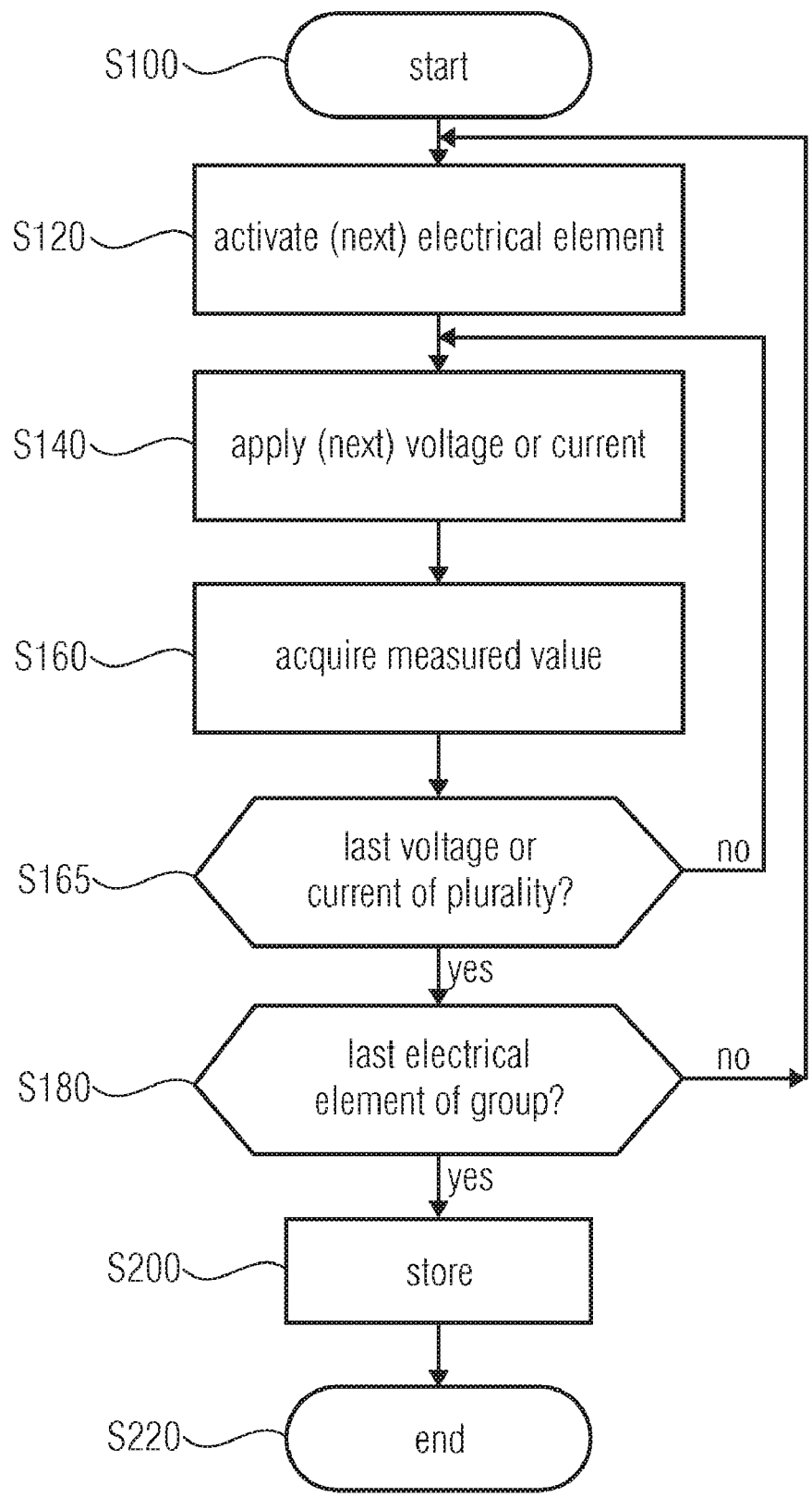
FIG. 15 shows a further flow chart of a method for acquiring data according to an embodiment of the present invention.

FIG. 15 shows a flow chart of a method for acquiring measurement data according to an embodiment of the present invention, which differs from the flow chart shown in FIG. 12 only in that the next voltage value or the next current value of a plurality of voltages or currents is applied, if need be, in the context of the step S140 of applying a voltage or a current to an electrical element 110 of the test chip 500. In addition, this method differs from the one shown in FIG. 12 in that a further verification is made, between the step S160 of acquiring a measured value and the verification as to whether the last electrical element of the group of electrical elements has been measured, as to whether the voltage applied or the current applied is the last one of the plurality of voltage values or current values. If this is not the case, the next voltage or the next current is applied in the context of a return to step S140. If, however, the last voltage or the last current of the plurality has already been applied in the context of step S165, a verification will be made in step S180 as to whether it is the last electrical element of the group of electrical elements.

The flow chart of a method for acquiring measurement data according to an embodiment of the present invention shown in FIG. 15 therefore specifically allows accommodating a characterization of the electrical elements in question comprising more than one measured value. In other words, what may be concerned is a method, which may be used for acquiring a current-voltage characteristic curve of the electrical elements 110 of the group of electrical elements 110, for example. Thus, the matter of concern is a method which may be used in the context of the so-called parametric re-measurement or measurement, for example.

In the case of a measurement based on an alternating-current or alternating-voltage signal, a change of the frequency of the signal in question, next to a change of the signal level, that is, the amplitude of the current or the voltage, is also possible. Current values and/or voltage values of the plurality of current or voltage values therefore optionally comprise the values (in the case of DC excitations), amplitude values (in the case of AC excitations) and frequencies (in the case of AC excitations) thereof. A mixture of AC and DC excitations may also be included. Therefore, a DC excitation may be performed by setting an evanescent frequency (such as 0 Hz).

Figure 16:
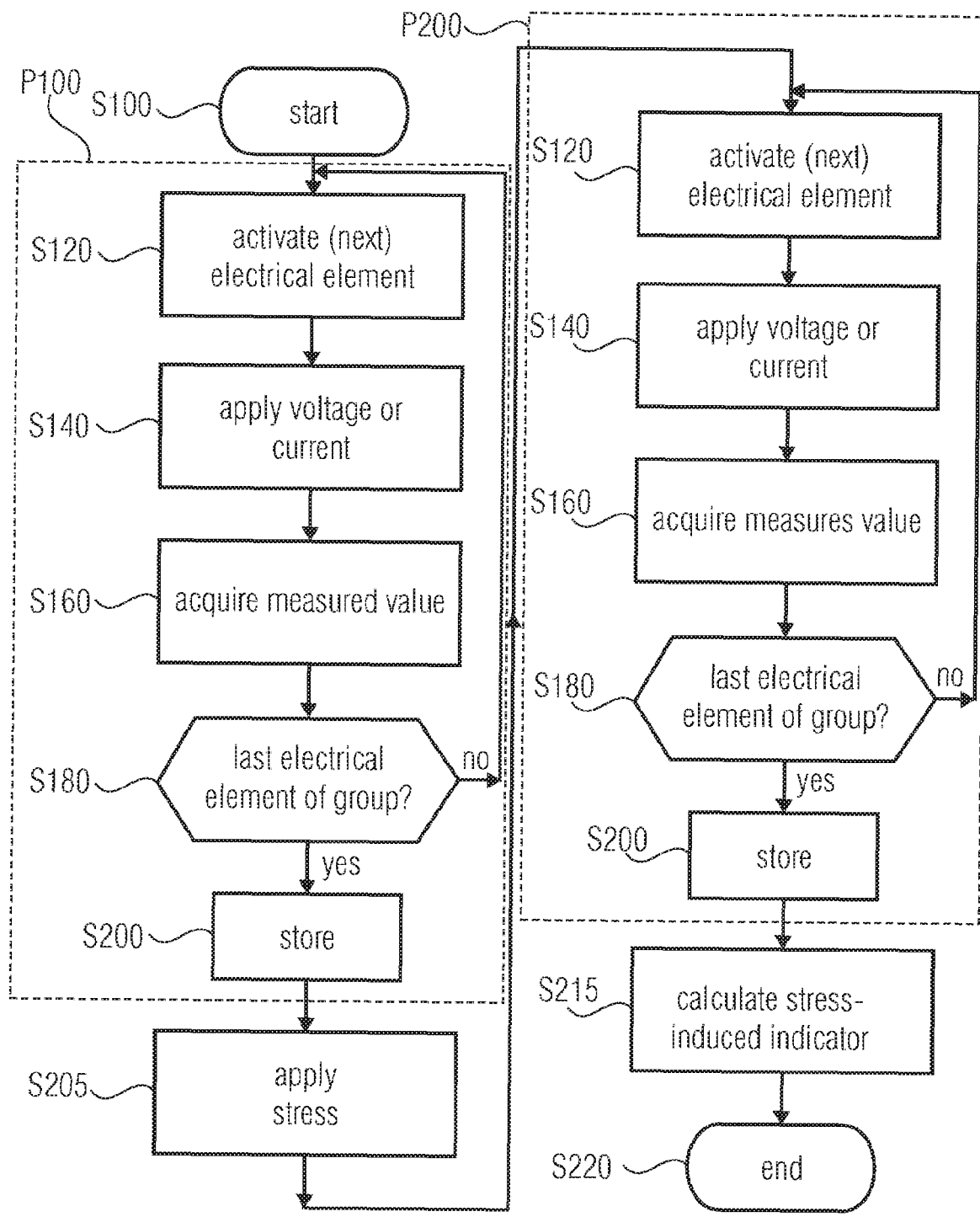
FIG. 16 shows a flow chart of a method according to an embodiment of the present invention.

FIG. 16 shows a further flow chart of a method according to an embodiment of the present invention comprising two process blocks P100 and P200, which, apart from the step of starting S100 and that of ending S220 correspond to the flow chart represented in FIG. 12. For this reason, reference is made to the description of the flow chart of FIG. 12 in view of the description of the individual method steps.

After starting the method in step S100, first the first process block P100 is executed, which is already represented in FIG. 12. Subsequently, the test chip 500 is subjected to a stress in a step S205. This may, for example, be a variation of the operating conditions such as an increase or decrease of the ambient temperature and humidity, an increase or decrease of the supply voltage beyond the specified values, a mechanical stress (such as vibrations, deformations) or any other thermal, electrical or chemical stress. Also a rapid change of the previously mentioned environmental influences may be exerted onto the test chip 500, such as a rapid cooling or a rapid heating. More complex cycles of optionally rapid temperature changes or other environmental changes may be applied. The stress may also be artificial aging, wherein, for example, the test chip 500 is subjected to ultraviolet or other radiation and/or chemically aggressive substances including, for example, ozone, acids or bases acting on the future final product during normal operation thereof.

Subsequently, a second process block P200 is effected, which also corresponds to the routine already illustrated in FIG. 12. What follows is a step S215, in the context of which a stress-induced indicator is calculated on the basis of the data stored in the steps S200 of the two process blocks P100 and P200 in consideration of the stress induced in the context of the step S205 before the method is ended in step S220. Such a stress-induced indicator may, for example, be a failure rate or another respective value or an assessment such as a rate of change of a resistance value. Optionally, this stress-induced data may of course be considered for further processing or consideration in optimization processes, for example.

Examples for such a stress-induced indicator are failure in time rates (FIT rates). Depending on the electrical element 110 under investigation, FIT rates may depend on a great variety of different parameters, such as electric fields, currents, temperatures and other operation-related and environmental-related parameters. In many cases the corresponding FIT rates are based on a Boltzmann-like law based on an activation energy appearing in an exponential expression of the Boltzmann relation. The activation energy may for instance be determined based on a logarithmic representation of the measured values or values derived from the measured values or an appropriate representation of the corresponding data based on a corresponding inverse functional relationship. A corresponding stress-induced indicator may, for instance, be a time after which statistically a predefined ratio of devices fail (e.g., 50% of the devices), the activation energy determined or corresponding energy or value.

In addition, the method routines represented in the context of FIGS. 12 to 16 may be combined with one another in view of their different method steps. It is therefore possible, in a modification of the method routine shown in FIG. 16, to replace one or both of the process blocks P100, P200 of FIG. 12 by those of FIG. 15, for example. This serves to calculate respective stress-induced indicators not only on the basis of an individual measured value or a value derived there from but in consideration of a plurality of respective values, that is, in consideration of a current-voltage characteristic curve of the electrical element 110 and the changes thereof, for example.

Of course, optionally, in the context of methods for acquiring measurement data, for one, some or all electrical elements 110 the applied currents or voltages may be stored along with the corresponding measured values, values derived from or information derived from the measured values. Similarly, other method steps can also be implemented. The sequence described is also not obligatory. Thus, after each acquiring of data, same or values or status information derived there from may be stored, for example.

The test concept discussed in the context of the present description as well as the array concept for the electrical on-chip analysis of electrical elements allows, in the context of the methods for acquiring measurement data, for defining several levels of error detection or trouble-spot detection, for example. It is, therefore, possible to specifically measure structures, which are within their specification but outside the main distribution. Similarly, embodiments of the present invention enable optimizing the testing time and the number of measurements performed in view of the required accuracy or resolution at which the respective data is to be available in future. Thus, it is possible to perform respective measurements on the basis of a (pseudo) random test pattern for a fast evaluation of an array.

Similarly, as has been discussed in the context of FIG. 16, a respective measurement of the electrical elements of an array may be completely or partly performed prior to performing a stress-induced test so as to facilitate identifying suspicious structures and store respective information. In the context of respective stress-induced tests, the temperature, thermal-mechanical stress, humidity and other influential factors may of course again be varied. Similarly, the entirety or parts of the array of electrical elements may be re-investigated after the application of the stress so as to identify conspicuous or suspicious structures and store respective information.

Figure 17:
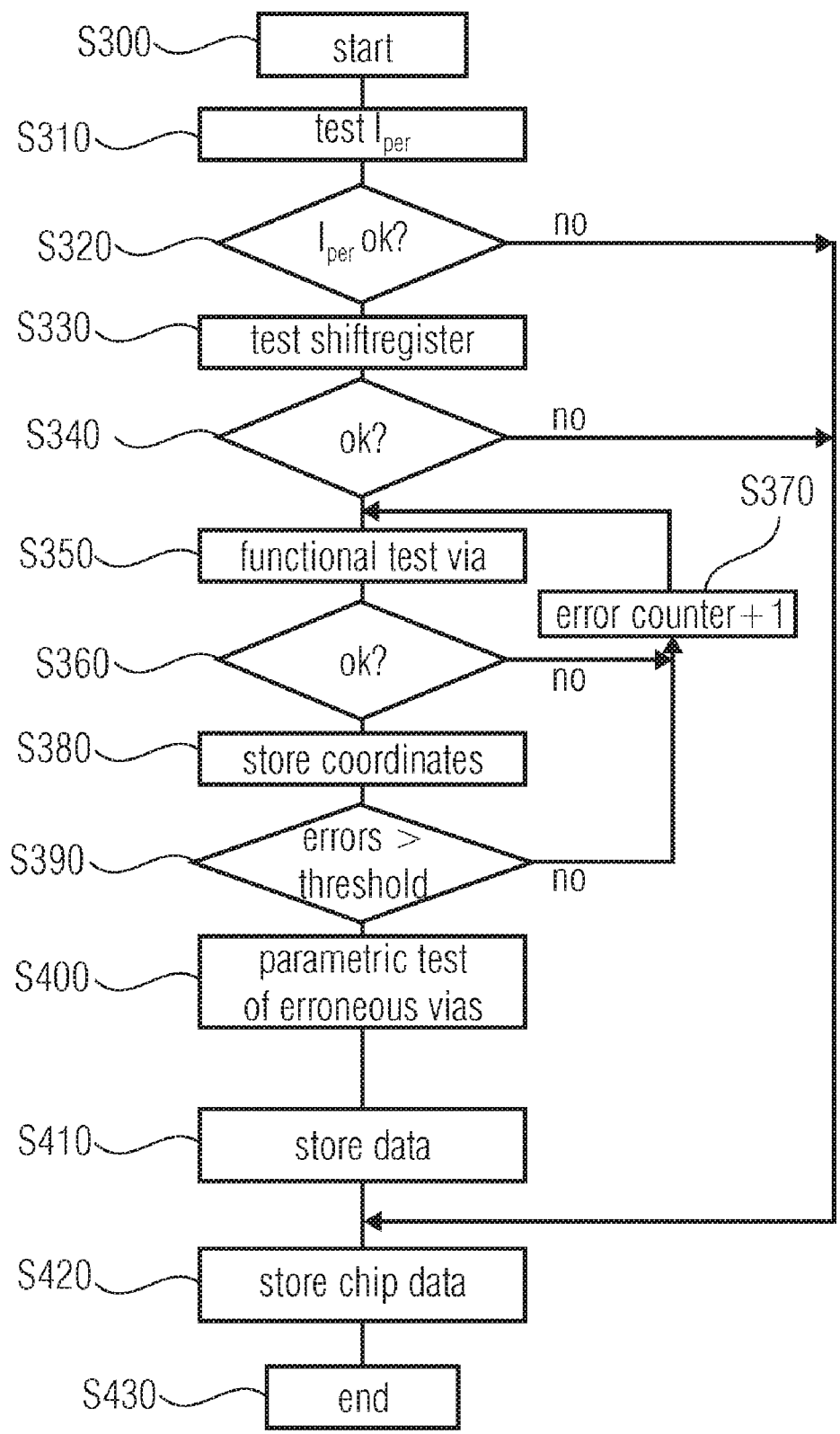
FIG. 17 shows a flow chart of a method according to an embodiment of the present invention.

FIG. 17 shows a further flow chart for a test method that may be performed with a semiconductor tester, for example. After a step of starting S300, first the current consumption of the address decoder or the input multiplexer 560, respectively is subjected to a test in a step S310. For this purpose, the measurement system 800 may determine the current consumption IPER of the input multiplexer or the entire peripheral circuit 630, respectively, of the test chip 500, for example, and verify, in a step S320, as to whether same exceeds a limit or undershoots another limit, for example.

If exceeding or undershooting a limit is detected in this test, the test method will be aborted at this point. In this case, it is not possible to investigate the test chip 500 and its cellular field 280, respectively. A jump is made to step S420.

In a next method step S330, the shift registers 570, 580 are tested as to whether they are continuous or fully operational. If an error is detected in the context of the verification (step S340), the test procedure is again aborted at this point. In this case, the test chip 500 or its cellular field 280 is also not in a condition to be tested. A jump is made to step S420.

In the course of a subsequent functional test of the vias or electrical elements 110 (step S350), which may, for example, correspond to the process block shown in FIG. 12, one or more measured values allowing for a conclusion to the operability of the vias or electrical elements 110 are acquired on the basis of a current or voltage fed to the electrical element(s) in question. In a step S360, same is evaluated as to whether it is in accordance with a condition regarding the measured value in question. If this is not the case, an error counter is raised by 1 in a step S370, and a next via or electrical element 110 is approached.

In a step S380, the coordinates or the address of the erroneous via(s) or electrical element(s) 110 are stored. Here, in the case of geometric coordinates, X and Y coordinates or else row and column addresses may be concerned. In a subsequent step S390, a verification is made as to whether the number of errors exceeds a fixed threshold value (such as a number Nerror). If this is not the case, the error counter is raised by 1 and a return to step S350 is made.

If, however, the number of errors is above this limit, the test will be aborted as in this case a serious process error is present, for the analysis of which the data collected hitherto is probably sufficient. In a step S400, which may, for example, correspond to the process block represented in FIG. 15, the erroneous vias or electrical elements 110 are investigated parametrically, that is, using a plurality of voltage, current and/or frequency values applied. That is, in step S400, all functionally failing vias are checked parametrically.

In a step S410, the values found are then output or stored, respectively. Same may include, for example, the X/Y coordinates of the vias in question, the current I_VIA flowing there through and the voltage U_VIA dropping there across. In the case of other electrical elements 110, other values may be stored, if need be.

Before the test method is ended in a step S430, first data regarding the test chip are stored or logged in a step S420. Same may include the X/Y coordinates of the test chip 500 on a wafer comprising the test chip, for example, when several test chips 500 are implemented on a wafer, for example.

Thus, the measurement results of the test are stored in the data file or the associated log file, respectively, in the steps S410 and S420 as a whole. Same may include the X/Y coordinates of the (test) chip 500 on the wafer, the X/Y coordinates or addresses of the failing vias as well as the measured values of the vias in question with respect to voltage (U_VIA) and current (I_VIA) for resistance calculation as well as, as the case may be, values (resistance value) calculated there from, for example.

Embodiments of the present invention may of course exhibit variations from this rough flow chart of a possible test program. Thus, further test chips 500 on a wafer may possibly be investigated, which may be approached by means of respective control signals of the control unit 850 to actors and motors of the electrical contact unit 810.

The actual measurement and investigation, respectively, of the test chip 500 may be followed by an evaluation, which may be optionally performed in a fully automated manner. In the case of the use of a semiconductor tester such as the TERADYNE J971, the measurement results may be present in a TERADYNE-specific data format, the so-called STDF+ format (STDF=Standard Teradyne Data Format), for example. This binary file may, if need be, be converted to another format such as a text-based format (e.g., ASCII format) by means of conversion programs. This format may then be used as a starting point for further data evaluations using a PERL script, for example.

Here, total failures, which may have occurred due to defective address decoders or shift registers, may be separated from the rest of the measurement results in an automated manner, for example. Similarly, a tabular output of chip coordinates, derivate types, via coordinates, voltage values (U_VIA), current values (I_VIA) and resistance values (R_VIA=U_VIA/I_VIA) derived there from may of course be output for detailed analysis. Similarly, statistic data compression on the wafer level may be performed, for example by determining the sum of measurable chips on each wafer per derivate type or else the sum of the erroneous vias and electrical elements per derivate type. A further possible statistical analysis is the determination of the erroneous vias per chip position on the wafer for generating a wafer map.

Thus, the data analysis may result in a comparison of data before and after a stress analysis on the wafer level. Similarly, structures exhibiting a resistance change during stress may be identified. A classification of the structures into different groups (resistance increase, general resistance movement, failures, no change) may also be achieved. Similarly, error rates and other failure rates may be determined.

This information may be used for determining an extrapolation of parameters so as to obtain data relevant for the future final product. As a result of this data, there is then the possibility to identify basic problems more specifically by means of physical error analysis and derive process improvements there from.

Embodiments of the present invention may therefore be employed in the field of front-end technologies or front-end process groups, respectively, as well as manufacturing sites thereof, for example. Thus, embodiments of the present invention specifically allow for accurate geometrical localization of failing vias and other electrical elements via their address, which is directly reflected in some applications. Thus, as has already been discussed, process improvements may be derived by performing electrical measurements for the identification of high-impedance vias. A physical preparation of these vias in the context of the physical error analysis may serve to detect the causes of failure and derive respective process improvements.

Planned process changes may also be made more safe as positive or negative influences of process changes in the area of the electrical elements to be investigated, such as in the via area, may be revealed by the test chip 500 before customer products are affected.

Furthermore, there is the possibility to determine a "robustness" of a process. By using via derivates, that is, intentional de-adjustments and other process changes, natural process variations may be simulated whereby process steps sensitive to de-adjustments may be identified and revealed.

A support of the defect-density monitoring in the via area is also possible. The electrical analysis of vias by the test chip may find defects that cannot be identified by means of the classical optical methods. These include errors in the actual via hole in the insulating layer between the two metal layers or a weak contact of the via material to the lower metal level, for example. Moreover, failure probabilities of vias may also be determined. By means of the test chip according to an embodiment of the present invention, the statistical failure probability of vias (e.g., because of defective via holes) may be determined. This parameter not least influences the yield planning of the process in question and renders same safer due to better knowledge.

The concept for investigating error sources by means of embodiments of the present invention described herein, such as the measurement of defects in vias (via holes) may, as has already been indicated in the introduction of this description, in principle also be applied to other technologies and electrical elements 110. Therefore, embodiments of the present invention are specifically independent from the technology in question with which the test wafers are produced. By means of a suitable adjustment of the individual components, such as by providing library elements in the context of the design process, respective cellular fields 280 may also be realized and utilized in other technologies. The device under test or electrical element 110 having frequently been described in the context of the preceding description, namely the via, may be replaced by other devices under test such as sensor elements or the other electrical elements previously mentioned. The range goes from simple contact holes to complete modules or sub-circuits of customer products. Examples thereof may be ALUs or other circuits of a higher complexity. Embodiments of the present invention therefore allow for obtaining statistically relevant data amounts with very little expenditure of test wafers as, on the test wafer, the module or electrical element to be investigated may be implemented much more frequently on a wafer than on a wafer with the final products.

Other than NMOS-, PMOS- or CMOS-based technologies may also be employed in the context of the fabrication of the test chips 500. Thus, the transistors in the field of the cells, multiplexers and other circuit elements described in the context of the present invention may of course also be realized in bipolar technology.

Depending on the circumstances, embodiments of the inventive methods may be implemented in hardware or in software. The implementation may be effected on a digital storage medium, in particular a floppy disk, CD or DVD, with electronically readable control signals, which may cooperate such with a programmable processor that an embodiment of an inventive method is effected. In general, embodiments of the present invention therefore also consist in a software program product and/or computer program product and/or program product with a program code stored on a machine-readable carrier for effecting an embodiment of an inventive method when the software program product runs on a computer or a processor. In other words, an embodiment of the present invention may therefore be realized as a computer program and/or software program and/or program with a program code for performing an embodiment of a method according to an embodiment of the present invention when the program runs on a processor. The processor may be formed by a computer, a chip card (smart card), an application-specific integrated circuit (ASIC) or another integrated circuit (IC).

What is claimed is:

1. An integrated circuit comprising:
   a plurality of cells, wherein each cell comprises
   a first supply node;
   a second supply node;
   a series connection with a first transistor, a second transistor and an electrical element, wherein the series connection is coupled between the first and the second supply node, and wherein the electrical element comprises a first and a second node;
   a third transistor coupled between the first node of the electrical element and a first output node of the cell; and
   a fourth transistor coupled between the second node of the electrical element and the second output node of the cell,
   wherein a control terminal of the first, the third and the fourth transistor is coupled to a first control node of the cell; and
   wherein a control terminal of the second transistor is coupled to a second control node of the cell.

2. The integrated circuit according to claim 1, wherein the plurality of cells is electrically arranged to form a two-dimensional array comprising a plurality of rows and a plurality of columns, wherein the first control node of the cells of each column are coupled to one of a plurality of column select lines such that each column select line of the plurality of column select lines couples the first control node of the cells of one column of the plurality of columns, and wherein the second control node of the cells of each row are coupled to one of a plurality of row select lines, such that each row select line of the plurality of row select lines couples the second control nodes of the cells of one row of the plurality of rows.

3. The integrated circuit according to claim 2, wherein the array comprises more than $2^{z-1}$ cells and not more than $2^z$ cells, wherein z is an integer equal to or larger than 2, wherein the array comprises $2^n$ rows and $2^m$ columns, wherein n and m are positive integers, wherein a sum of n and m is equal to z, and wherein n is equal to or larger than $3/10 \cdot z$ and is equal to or smaller than $7/10 \cdot z$.

4. The integrated circuit according to claim 2, further comprising an input multiplexer comprising a plurality of row select signal outputs and the plurality of column select signal outputs, wherein the row select signal outputs are coupled to the row select lines, wherein the column select signal outputs are coupled to the column select lines, and wherein the input multiplexer is adapted to provide the row select signal and the column select signal to the plurality of row select outputs and the plurality of column select signal outputs based on the control signal provided to the input multiplexer.

5. The integrated circuit according to claim 4, wherein the input multiplexer is adapted to receive an address signal as the control signal and to generate the row select signal and the column select signal, such that each combination of the row select signal and the column select signal corresponds to a different address.

6. The integrated circuit according to claim 4, wherein the input multiplexer is adapted to provide a row select signal comprising one of a plurality of signal levels, and wherein the second transistor is adapted such that a resistance value of the second transistor depends on the signal level of the row select signal provided to the control input of the second transistor.

7. The integrated circuit according to claim 6, wherein input multiplexer comprises a control reference node for a reference control signal, and wherein the signal level of the row select signal is based on the reference control signal.

8. The integrated circuit according to claim 1, further comprising an output multiplexer comprising a plurality of first inputs, a plurality of second inputs, a first output and a second output, wherein the plurality of first inputs is coupled to the first output nodes of the cells of the plurality of cells, wherein the plurality of second inputs is coupled to the second output nodes of the cells of the plurality of cells, and wherein the output multiplexer is adapted to couple one of the plurality of first inputs to the first output and one of the plurality of second inputs to the second output, such that the first output and the second output are coupled to the first output node and the second output node of the same cell of the plurality of cells.

9. The integrated circuit according to claim 8, wherein the plurality of cells is electrically arranged to form a two-dimensional array comprising a plurality of rows and a plurality of columns, wherein each of the first inputs of the output multiplexer is coupled to the first output nodes of the cells of one row of the plurality of rows, and wherein each of the second inputs of the output multiplexer is coupled to the second output nodes of the cells of one row of the plurality of rows.

10. The integrated circuit according to claim 9, wherein the output multiplexer is adapted to couple the first output nodes and the second output nodes of the cells of one row based on a select signal of the row select line, wherein the row select line is coupled to the first control nodes of the cells of the corresponding row.

11. The integrated circuit according to claim 8, further comprising an amplifier coupled to at least one of the first output and the second output of the output multiplexer and adapted to provide a measured signal from the output multiplexer in an amplified form.

12. The integrated circuit according to claim 1, wherein the first supply nodes of the cells are coupled to a first supply terminal of the Integrated circuit, and wherein the second supply nodes of the cells are coupled to a second supply terminal of the integrated circuit.

13. The integrated circuit according to claim 1, wherein the cells of the plurality of cells are geometrically arranged over an area of the integrated circuit, such that the electrical elements are arranged over the area or wherein at least two electrical elements of the plurality of cells differ with respect to an element-specific, a manufacturing process-related or a geometry-related parameter.

14. The integrated circuit according to claim 1, wherein the electrical element comprises at normal operational conditions impedance values of 100Ω or below at a predefined measurement frequency or at a DC excitation.

15. A method for acquiring data of an integrated circuit comprising a plurality of cells, each cell comprising an electrical element having a first node coupled to a first supply node of the cell and a first output node of the cell and having a second node coupled to a second supply node of the cell and a second output node of the cell, the method comprising:
   activating each electrical element of a group of the electrical elements of the plurality of cells sequentially; and
   for each activated electrical element applying a voltage or a current to the first supply node of the corresponding cell of the electrical element;

acquiring a measured value of the activated electrical element; and storing at least one measured value or at least one value or piece of information derived from a measured value.

16. The method according to claim 15, further comprising for each activated electrical element comparing the measured value to a predetermined, fixed, adjustable or programmable condition, and wherein storing at least one piece of information derived from a measured value comprises storing an information indicating that the measured value does not fulfill the condition, when the measured value does not fulfill the condition.

17. The method according to claim 16, further comprising activating each electrical element of the group of electrical elements sequentially, which has fulfilled the condition, and for each activated electrical element applying a plurality of voltages or currents and acquiring a measured value for each applied voltage or current.

18. The method according to claim 15, wherein applying a voltage or current and acquiring a measured value for each activated electrical element comprises applying a plurality of voltages or a plurality of currents and acquiring a measured value for each applied voltage or current.

19. The method according to claim 15, further comprising applying an environmental, thermal, mechanical, supply-induced or chemical stress to the integrated circuit after applying a voltage or a current and acquiring a measured value for each activated electrical element of the group of electrical elements, after applying the stress activating each electrical element of the group sequentially, and for each activated electrical element applying the voltage or the current to the first supply node of the corresponding cell of the electrical element, acquiring a measured value of the activated electrical element, and storing at least one measured value or at least one value or piece of information derived from a measured value.

20. The method according to claim 19, further comprising comparing the stored measured values, or pieces of information derived from the measured values before and after applying the stress, and calculating a stress-induced indicator based on the comparison.

21. The method according to claim 15, further comprising optimizing a design layout or a manufacturing process based on the stored measured values, values or pieces of information and based on a set of design-related, element-related or manufacturing process-related parameters of the respective electrical elements.

22. The method according to claim 15, wherein activating each electrical element of the group sequentially comprises providing an address signal inductive of an address of an electrical element to be activated to the integrated circuit.

23. The method according to claim 15, wherein acquiring a measured value comprises sensing and determining a voltage between a first and a second output terminal of the integrated circuit.

24. A measurement system comprising:
a supply unit;
a measurement unit;
a control unit; and
an electrical contact unit adapted to electrically contact an integrated circuit comprising a plurality of cells, each cell comprising an electrical element having a first node coupled to a first supply node of the cell and a first output node of the cell and having a second node coupled to a second supply node of the cell and a second output node of the cell, the integrated circuit further comprising a first and a second supply terminal of the integrated circuit, a first and a second output terminal of the integrated circuit, and a terminal for an address signal,
wherein the electrical contact unit is adapted to transmit an address signal provided to the electrical contact unit by the control unit to the terminal for the address signal of the integrated circuit;
wherein the electrical contact unit is adapted to transmit a voltage or a current to a first and a second supply terminal of the integrated circuit provided to the electrical contact unit by the supply unit;
wherein the electrical contact unit is adapted to transmit a measurement signal from the first and the second output terminal of the integrated circuit to the measurement unit;
wherein the supply unit is coupled to the control unit and adapted to provide a voltage or a current to the electrical contact unit in response to a supply control signal generated by the control unit;
wherein the measurement unit is coupled to the control unit and adapted to provide an acquired measurement signal comprising a measured value to the control unit; and
wherein the control unit is adapted to generate an address signal for each electrical element of the group of electrical elements of the integrated circuit sequentially and to generate a supply control signal for each activated electrical element and to receive an acquired measurement signal comprising the measured value for each activated electrical element and to store at least one measured value or at least one value or piece of information derived from the measured values.

25. A computer program for performing, when running on a processor, a method for acquiring data of an integrated circuit comprising a plurality of cells, each cell comprising an electrical element having a first node coupled to a first supply node of the cell and having a first output node of the cell and couples with a second node to a second supply node of the cell and a second output node of the cell, the method comprising:
activating each electrical element of a group of the electrical elements of the plurality of cells sequentially; and
for each activated electrical element
applying a voltage or a current to the first supply node of the corresponding cell of the electrical element;
acquiring a measured value of the activated electrical element; and
storing at least one measured value or at least one value or piece of information derived from a measured value.

* * * * *